United States Patent
More et al.

(10) Patent No.: US 11,515,162 B2
(45) Date of Patent: Nov. 29, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Shahaji B. More, Hsinchu (TW); Chandrashekhar Prakash Savant, Hsinchu (TW); Chun Hsiung Tsai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 144 days.

(21) Appl. No.: 17/008,354

(22) Filed: Aug. 31, 2020

(65) Prior Publication Data
US 2022/0068650 A1    Mar. 3, 2022

(51) Int. Cl.
| | |
|---|---|
| H01L 21/764 | (2006.01) |
| H01L 21/28 | (2006.01) |
| H01L 21/285 | (2006.01) |
| H01L 21/3215 | (2006.01) |
| H01L 29/06 | (2006.01) |
| H01L 29/08 | (2006.01) |
| H01L 29/45 | (2006.01) |
| H01L 29/49 | (2006.01) |
| H01L 29/66 | (2006.01) |
| H01L 29/78 | (2006.01) |

(52) U.S. Cl.
CPC .. *H01L 21/28088* (2013.01); *H01L 21/28518* (2013.01); *H01L 21/3215* (2013.01); *H01L 21/764* (2013.01); *H01L 29/0653* (2013.01); *H01L 29/0847* (2013.01); *H01L 29/45* (2013.01); *H01L 29/4966* (2013.01); *H01L 29/66545* (2013.01); *H01L 29/66636* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 9,935,173 | B1* | 4/2018 | Wu | H01L 21/823437 |
| 10,468,269 | B2* | 11/2019 | Yang | H01L 21/76873 |
| 2009/0140338 | A1* | 6/2009 | Gauthier, Jr. | H01L 29/66636 257/350 |
| 2017/0103948 | A1* | 4/2017 | Lee | H01L 23/485 |
| 2017/0154958 | A1* | 6/2017 | Fung | H01L 29/42392 |
| 2018/0315647 | A1* | 11/2018 | Wang | H01L 21/76865 |

* cited by examiner

*Primary Examiner* — Ali Naraghi
(74) *Attorney, Agent, or Firm* — McDermott Will & Emery LLP

(57) ABSTRACT

In a method of manufacturing a semiconductor device, a gate dielectric layer is formed over a channel region in a gate space, one or more conductive layers are formed over the gate dielectric layer, a seed layer is formed over the one or more conductive layers, an upper portion of the seed layer is treated by introducing one or more elements selected from the group consisting of oxygen, nitrogen and fluorine, and a W layer is selectively formed on a lower portion of the seed layer that is not treated to fully fill the gate space with bottom-up filling approach.

20 Claims, 24 Drawing Sheets

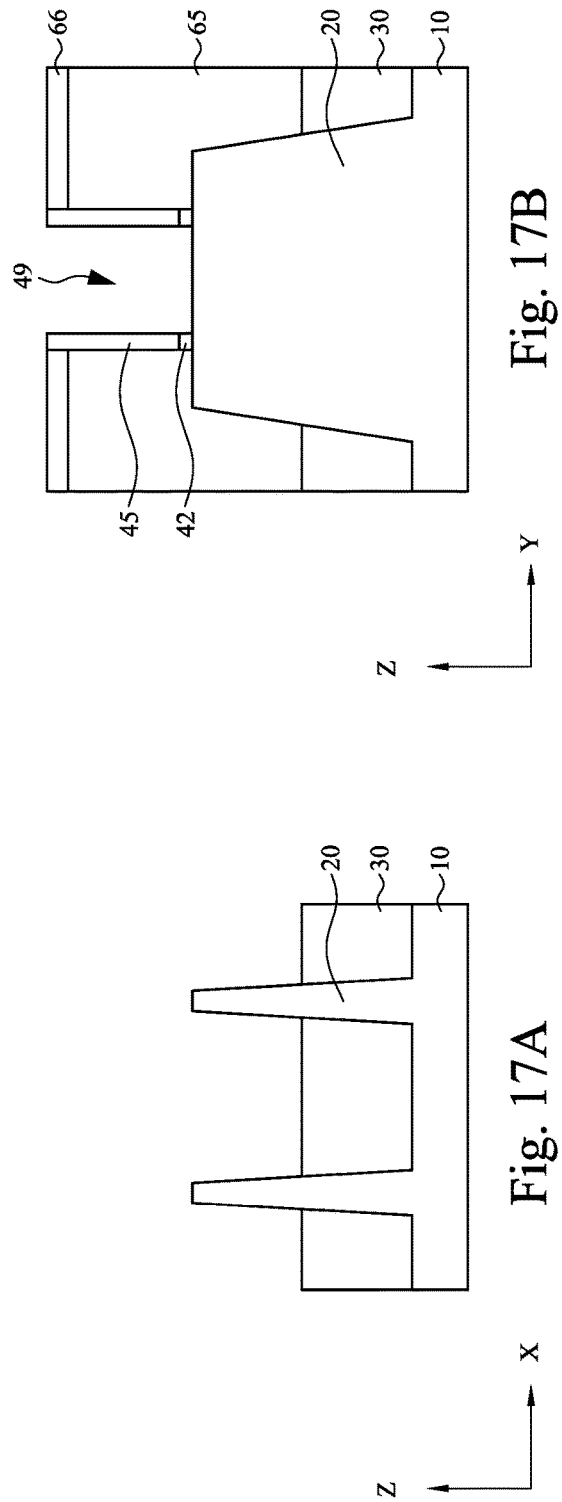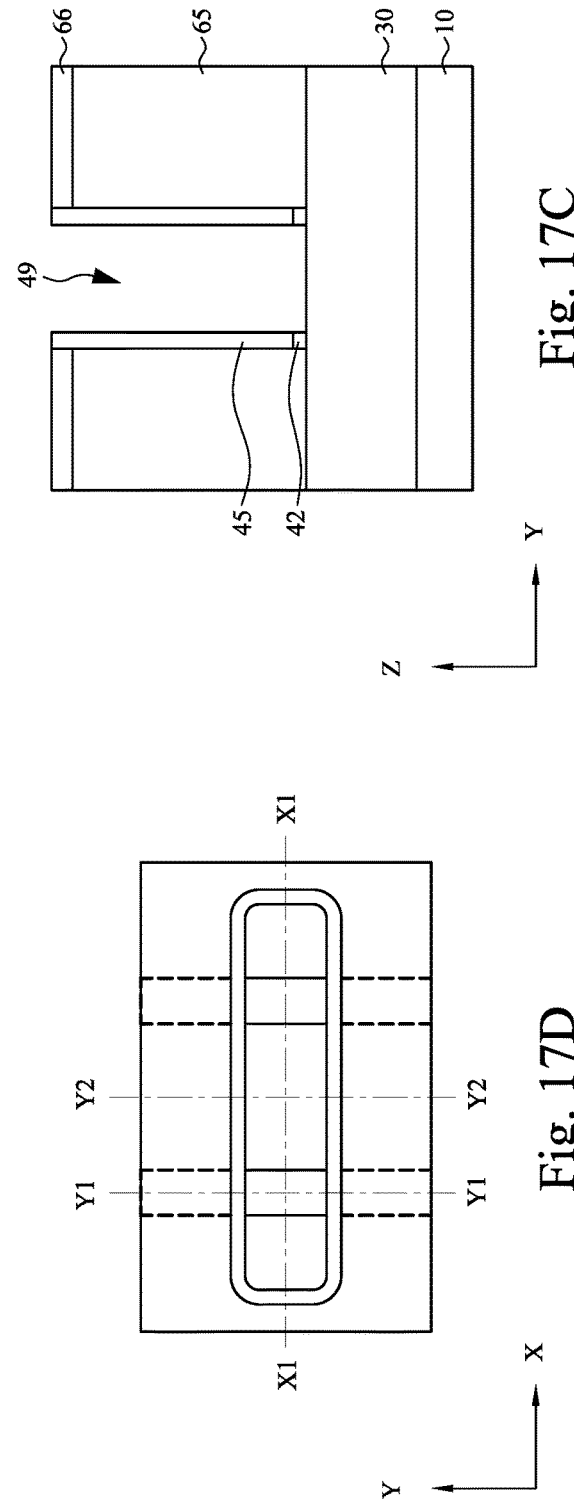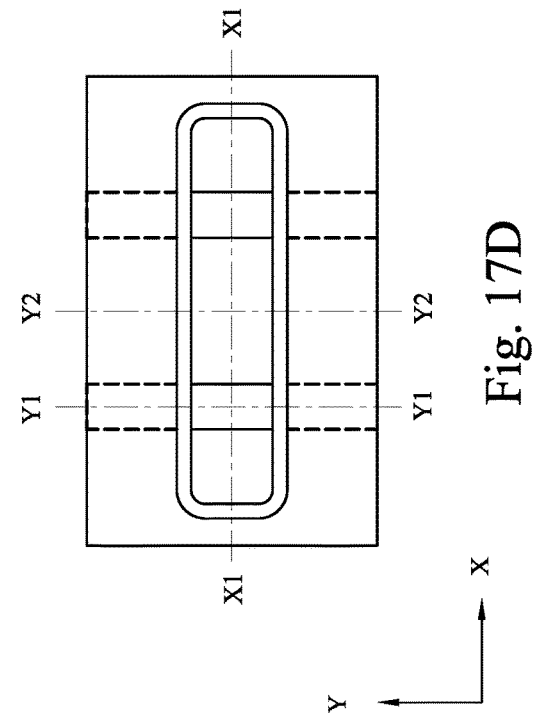
Fig. 17A  Fig. 17B  Fig. 17C  Fig. 17D

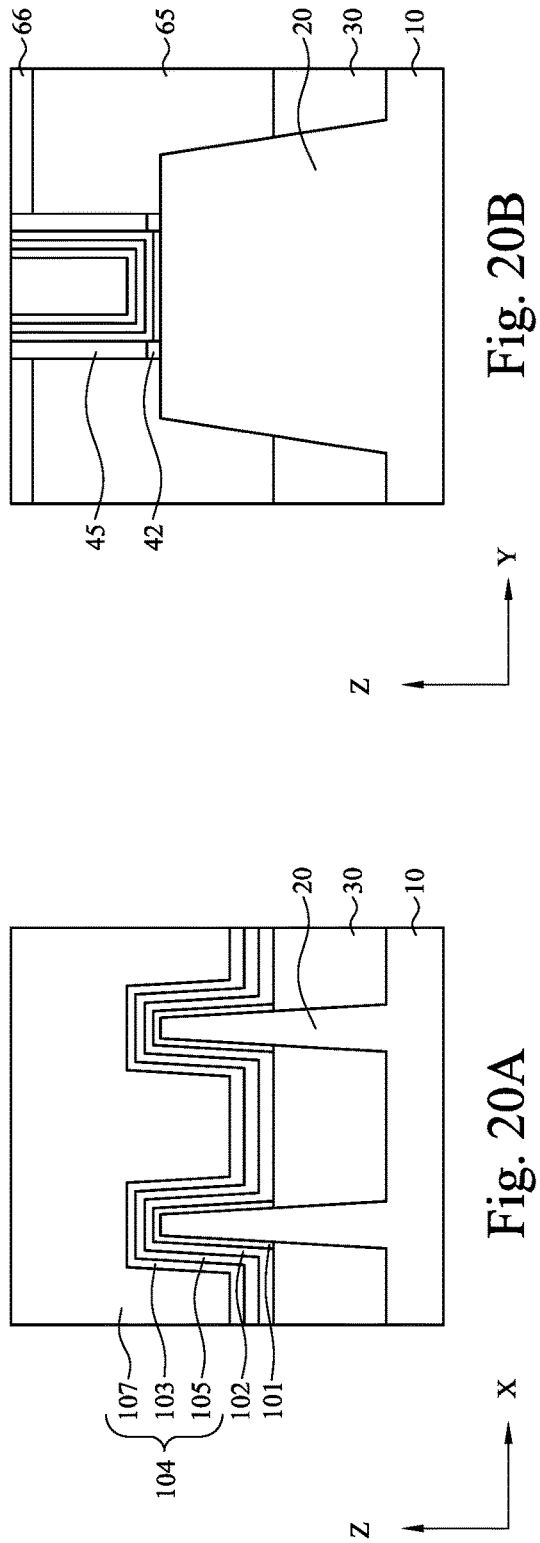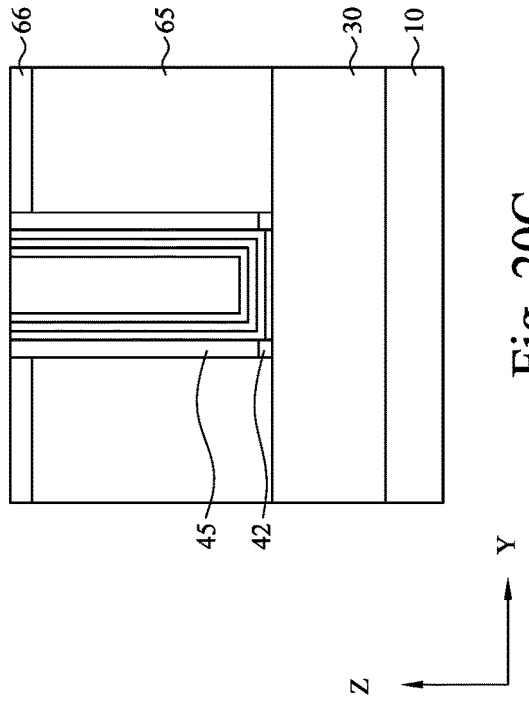
Fig. 20A
Fig. 20B
Fig. 20C

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. A gate electrode of a FinFET includes one of more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A, 17B, 17C and 17D show various stages of a sequential process for a gate replacement operation according to an embodiment of the present disclosure.

FIGS. 20A, 20B and 20C show various stages of a sequential process for a gate replacement operation according to an embodiment of the present disclosure.

DETAILED DESCRIPTION

Figure 2:
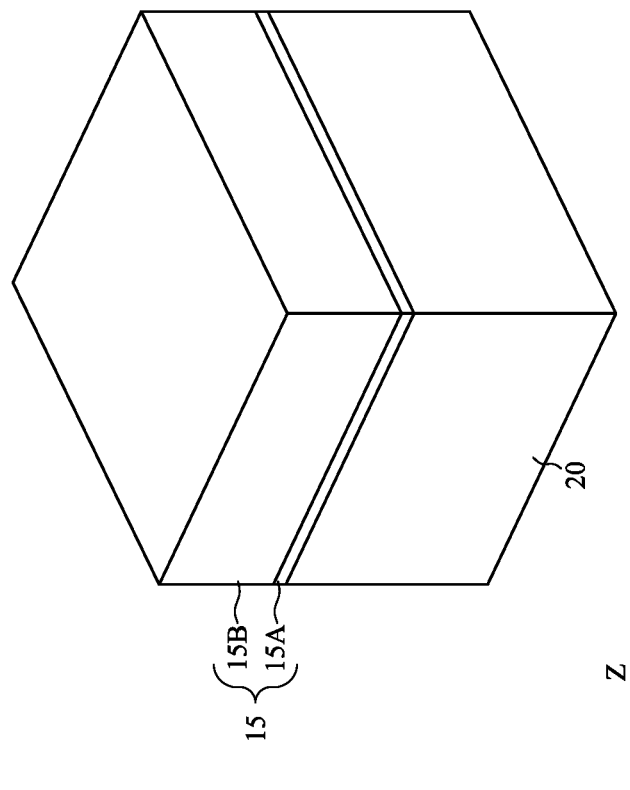
FIG. 2 shows one of the stages of a sequential process for manufacturing a FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In metal gate FinFETs, device performance is affected by a metal gate profile (shape) design, and the metal gate profile is often dependent on the profile of a sacrificial gate electrode. In some FinFET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FinFET devices, various FETs (n-channel and p-channel FETs) with different threshold voltages are fabricated in one device and FETs may have different metal (e.g., work function adjustment metals) structures. Gate recess etching to form a gate cap may be affected by the metal structures and it is desirable to recess the metal gate structure to a desired level regardless of the metal structures. In the present disclosure, a method of controlling heights of the recessed metal gate structure by adjusting a profile (shape) of the sacrificial gate electrode is provided.

FIGS. 1-16 show a sequential process for manufacturing an FET device according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
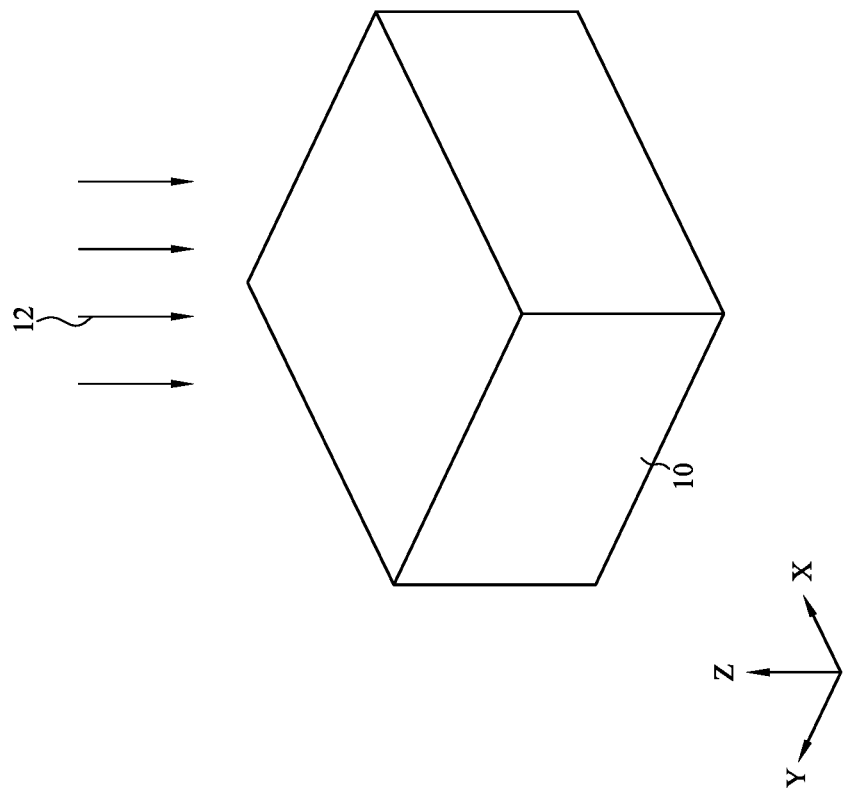
FIG. 1 shows one of the stages of a sequential process for manufacturing a FET device according to an embodiment of the present disclosure.

As shown in FIG. 1, impurity ions (dopants) 12 are implanted into a silicon substrate 10 to form a well region. The ion implantation is performed to prevent a punch-through effect.

In one embodiment, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of a silicon nitride and the second mask layer 15B is made of a silicon oxide. In other embodiments, the first mask layer 15A is made of a silicon oxide and the second mask layer 15B is made of a silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
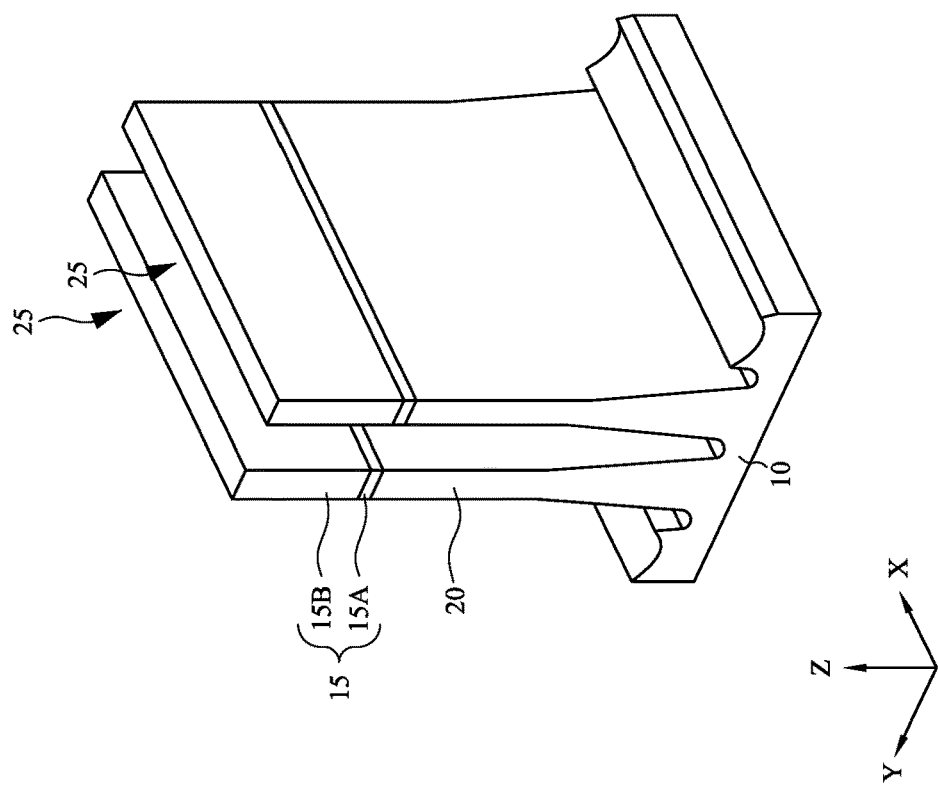
FIG. 3 shows one of the stages of a sequential process for manufacturing a FET device according to an embodiment of the present disclosure.

Next, as shown in FIG. 3, the substrate 10 is patterned by using the patterned mask layer 15 into fin structures 25 extending in the X direction. In FIG. 3, two fin structures 25 are arranged in the Y direction. However, the number of the fin structures is not limited to two, and may be as small as one and three or more. In some embodiments, one or more dummy fin structures are formed on both sides of the fin structures 25 to improve pattern fidelity in the patterning operations.

The fin structures 25 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structure is formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer 30 as shown in FIG. 4.

Figure 4:
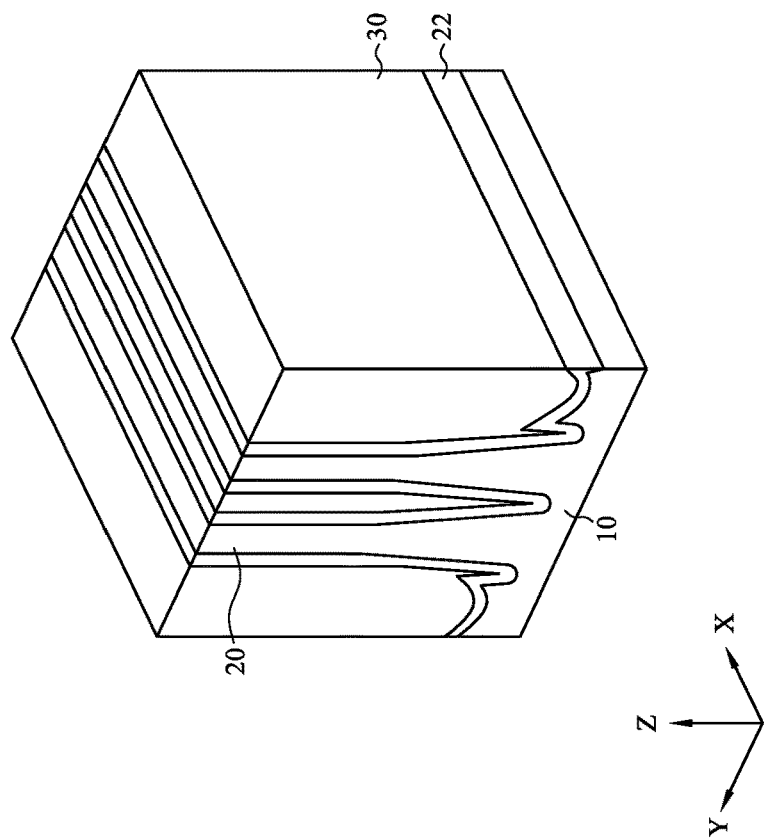
FIG. 4 shows one of the stages of a sequential process for manufacturing a FET device according to an embodiment of the present disclosure.

In some embodiments, one or more liner layers 22 are formed over the structure of FIG. 3 before forming the insulating material layer 40, as shown FIG. 4. The liner layer 22 includes one or more of silicon nitride, SiON, SiCN, SiOCN, and silicon oxide.

Figure 5:
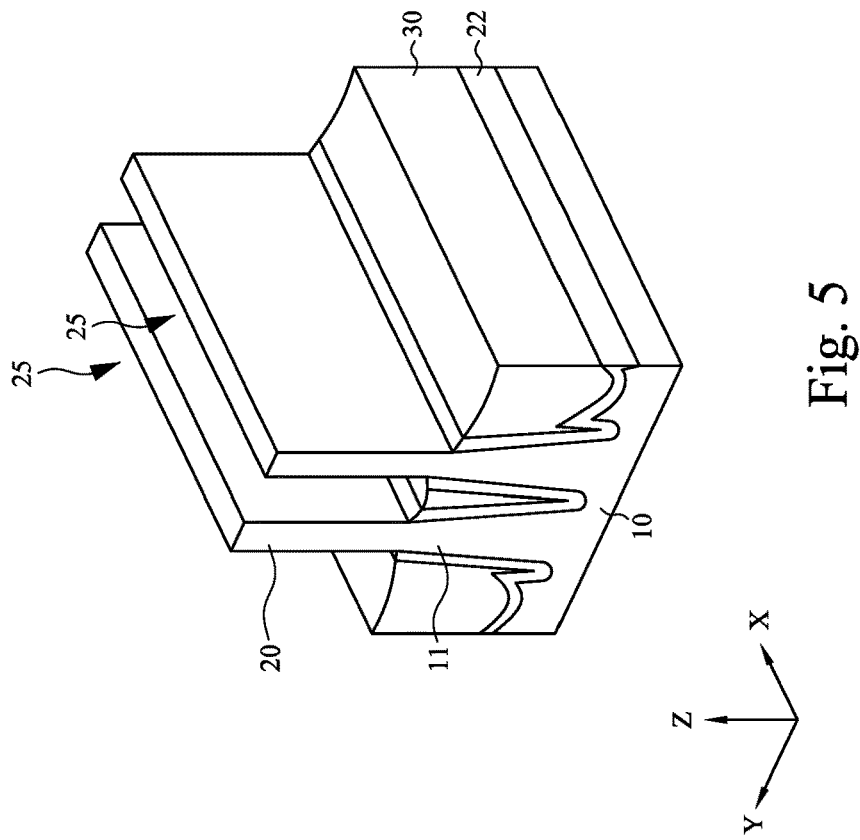
FIG. 5 shows one of the stages of a sequential process for manufacturing a FET device according to an embodiment of the present disclosure.

Then, as shown in FIG. 5, the insulating material layer 30 is recessed to form an isolation insulating layer 30 so that the upper portions of the fin structures 20 are exposed. With this operation, the fin structures 25 are electrically separated from each other by the isolation insulating layer 30, which is also called a shallow trench isolation (STI). The lower portion 11 of the fin structure is embedded in the isolation insulating layer 30.

Figure 6:
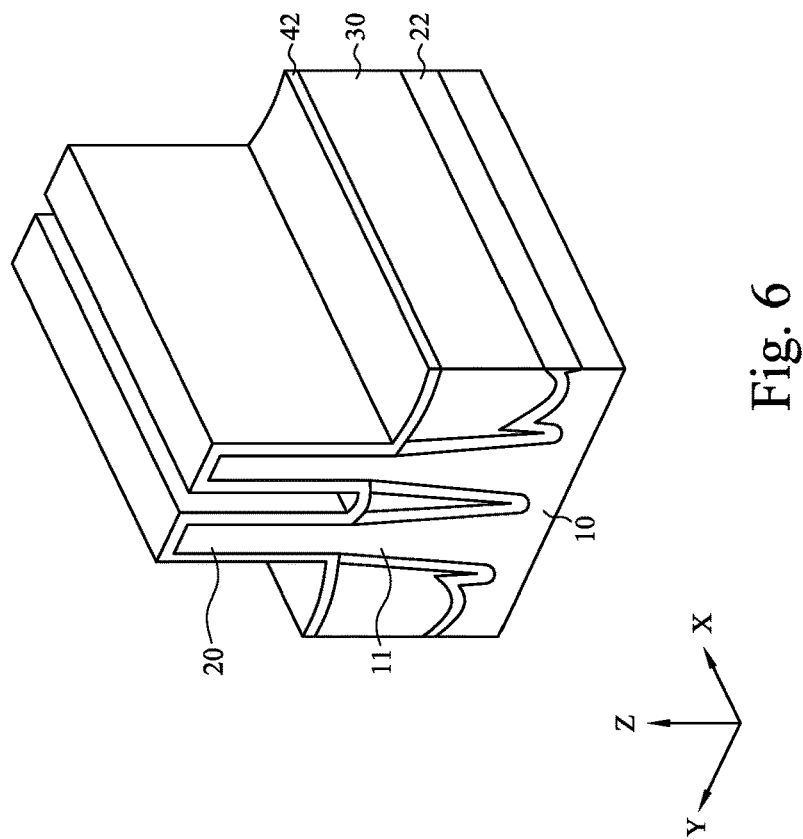
FIG. 6 shows one of the stages of a sequential process for manufacturing a FET device according to an embodiment of the present disclosure.

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

Figure 7:
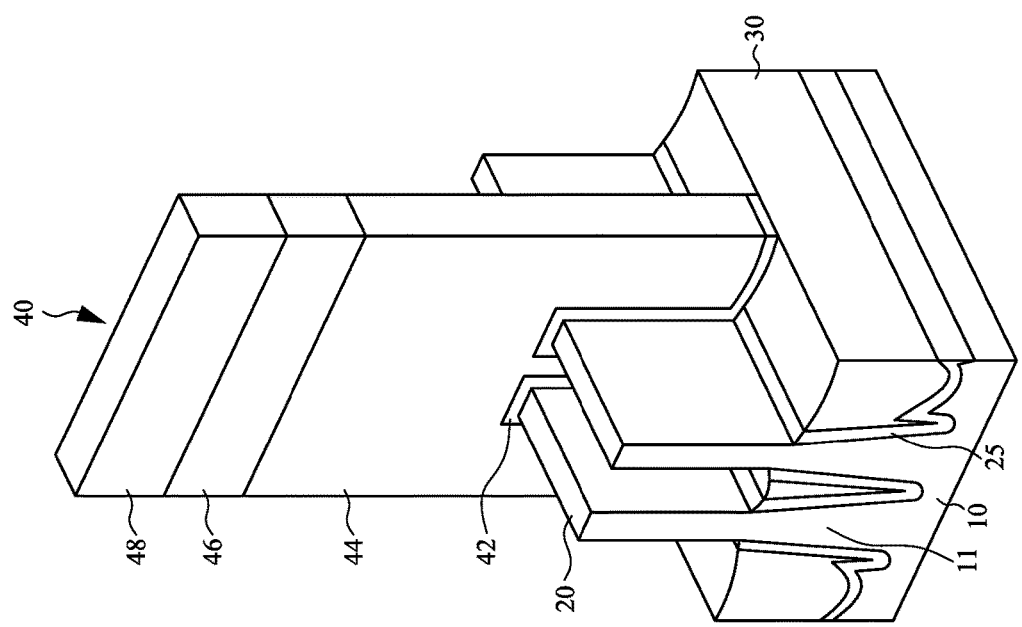
FIG. 7 shows one of the stages of a sequential process for manufacturing a FET device according to an embodiment of the present disclosure.

FIG. 7 illustrates a structure after a sacrificial gate structure 40 is formed over the exposed fin structures 25. The sacrificial gate structure includes a sacrificial gate electrode 44 and the sacrificial gate dielectric layer 42. The sacrificial gate structure 40 is formed over a portion of the fin structure, which is to be a channel region. The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 46 and a silicon oxide mask layer 48.

Next, a patterning operation is performed on the mask layer and the sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad silicon nitride layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
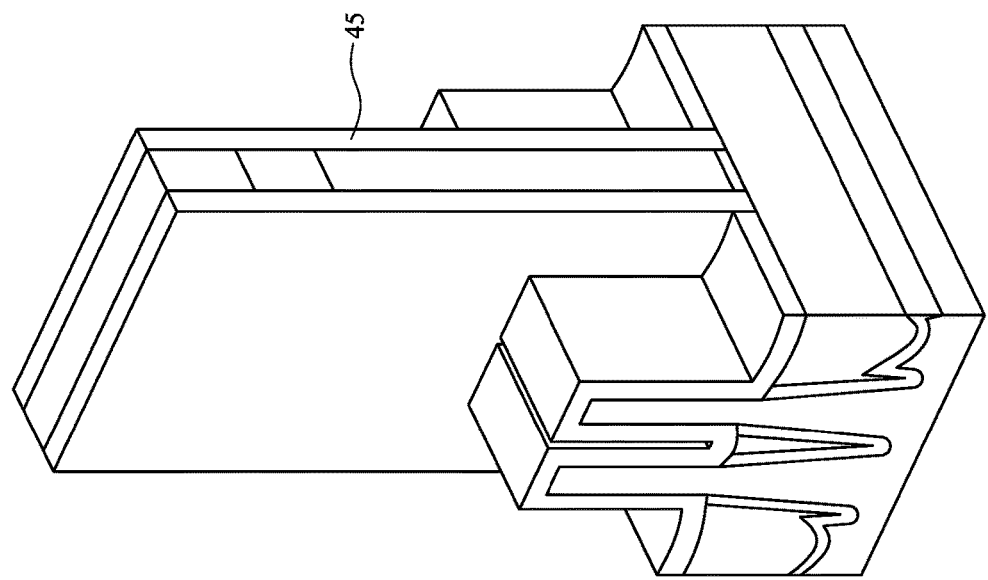
FIG. 8 shows one of the stages of a sequential process for manufacturing a FET device according to an embodiment of the present disclosure.

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
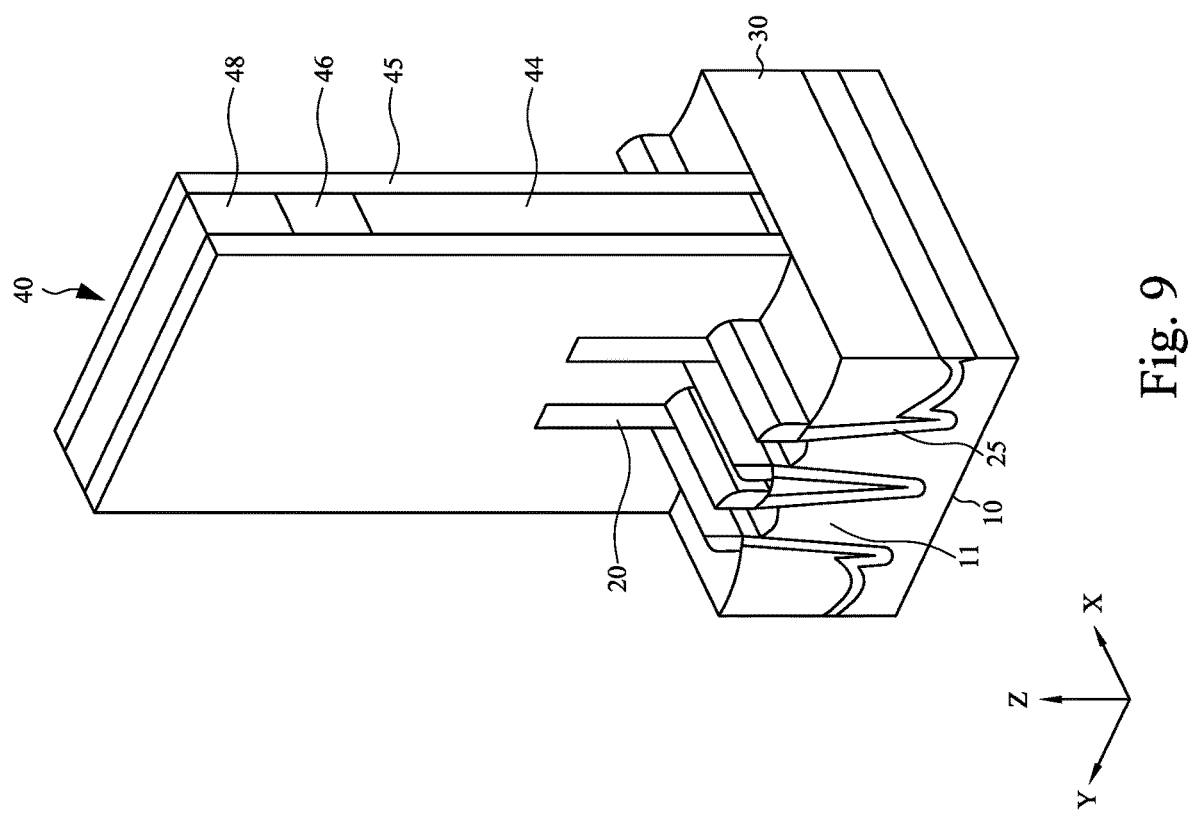
FIG. 9 shows one of the stages of a sequential process for manufacturing a FET device according to an embodiment of the present disclosure.

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 25.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed.

Figure 10:
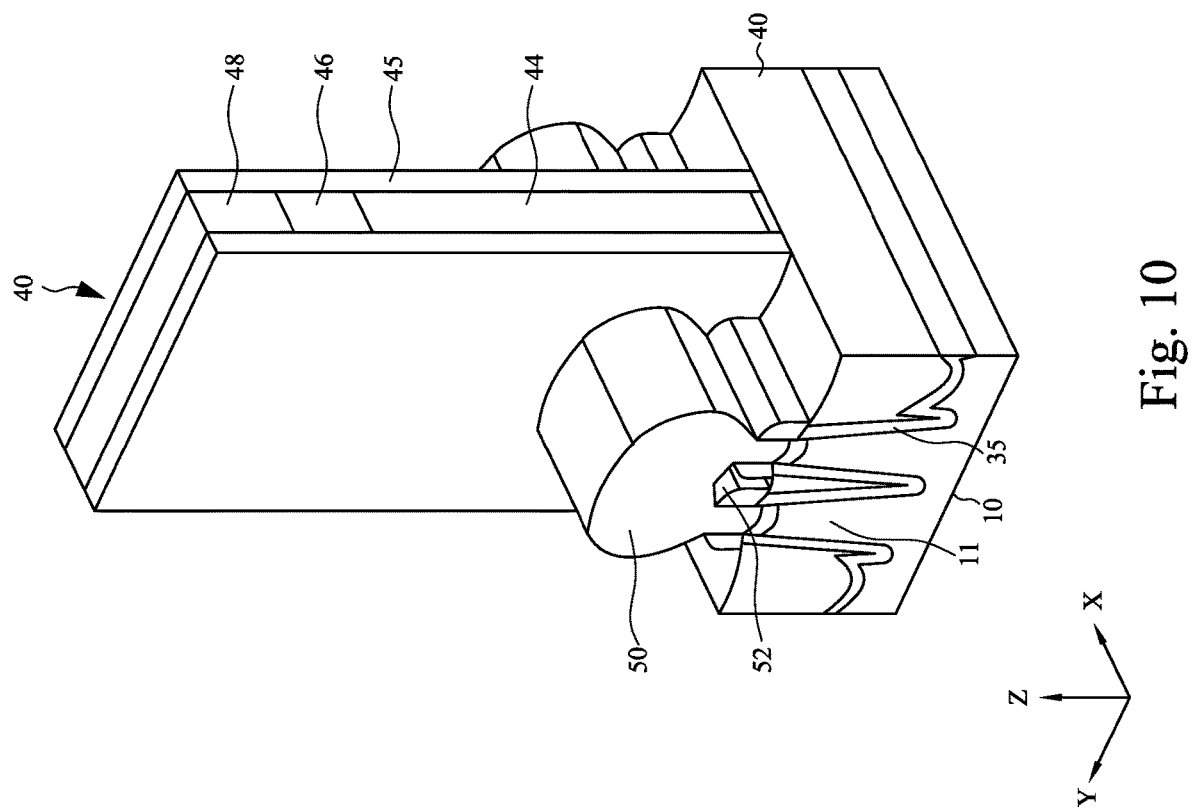
FIG. 10 shows one of the stages of a sequential process for manufacturing a FET device according to an embodiment of the present disclosure.

Subsequently, as shown in FIG. 10, source/drain (S/D) epitaxial layers 50 are formed. The S/D epitaxial layers 50 include one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
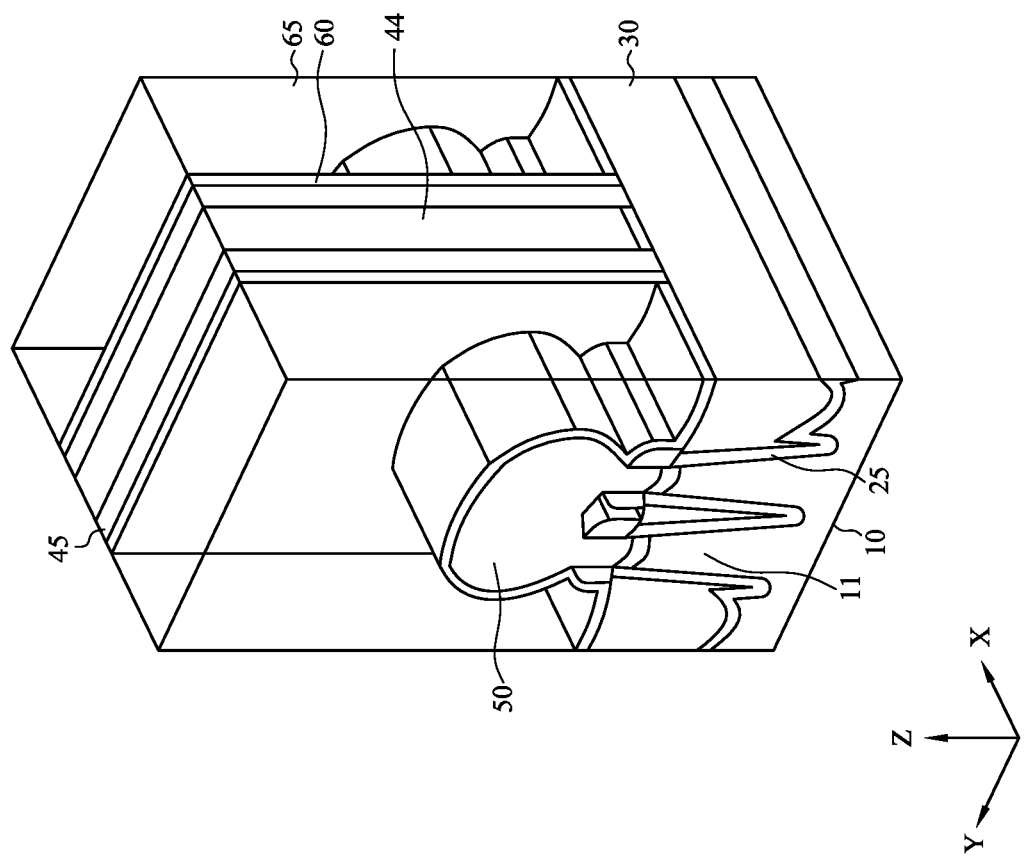
FIG. 11 shows one of the stages of a sequential process for manufacturing a FET device according to an embodiment of the present disclosure.

Subsequently, an insulating liner layer 60, as an etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, 0, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 11.

Figure 12:
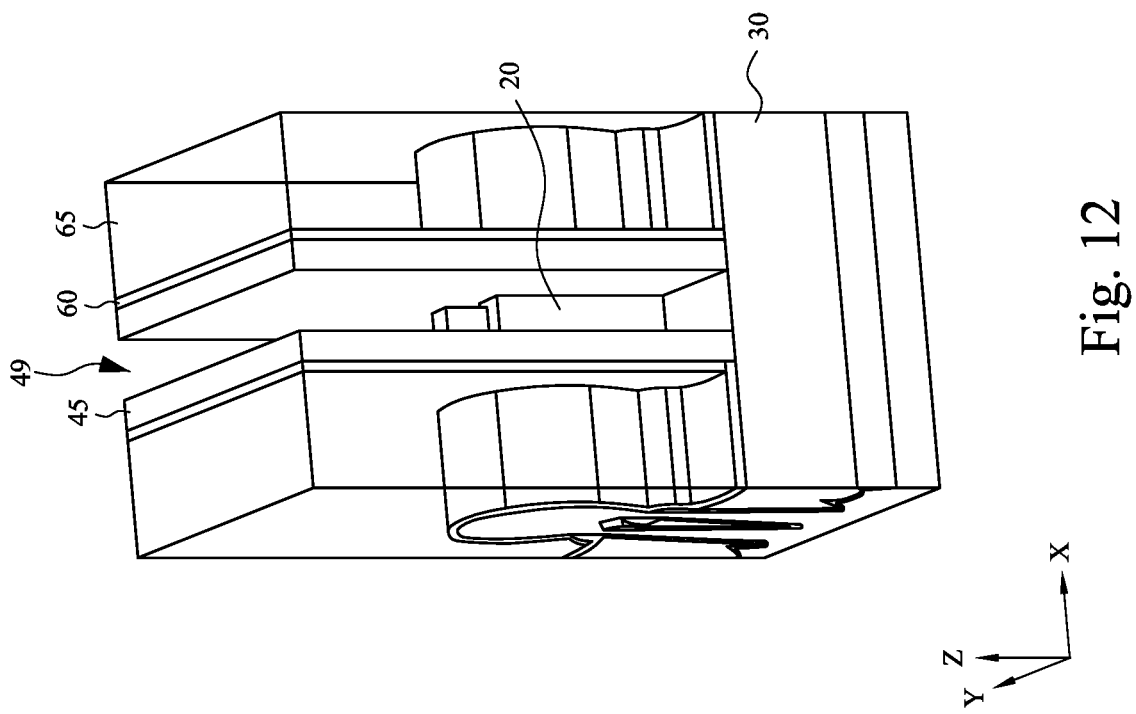
FIG. 12 shows one of the stages of a sequential process for manufacturing a FET device according to an embodiment of the present disclosure.

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 54. The sacrificial gate dielectric layer 42 is thereafter removed using plasma dry etching and/or wet etching.

Figure 13:
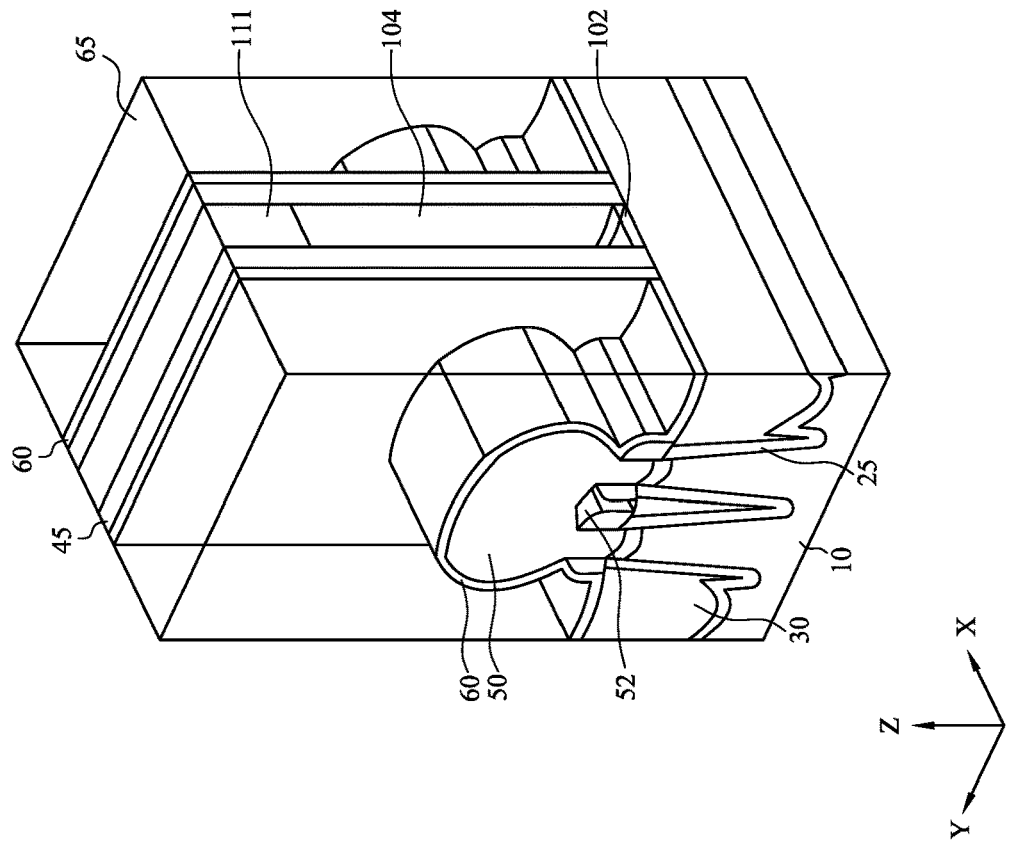
FIG. 13 shows one of the stages of a sequential process for manufacturing a FET device according to an embodiment of the present disclosure.

After the sacrificial gate structures are removed, a gate dielectric layer 102 is formed around the exposed fin structures 20, and a gate electrode layer 104 is formed on the gate dielectric layer 102, as shown in FIG. 13.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness on the channel regions. The thickness of the gate dielectric layer 102 is in a range from about 1 nm to about 6 nm in one embodiment.

The gate electrode layer 104 is formed on the gate dielectric layer 102. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlC, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 104 is recessed and a cap insulating layer 111 is formed over the recessed gate electrode 104, as shown in FIG. 13. The cap insulating layer includes one or more layers of a silicon nitride-based material, such as SiN. The cap insulating layer 111 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, WN, WCN, Ru, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 14:
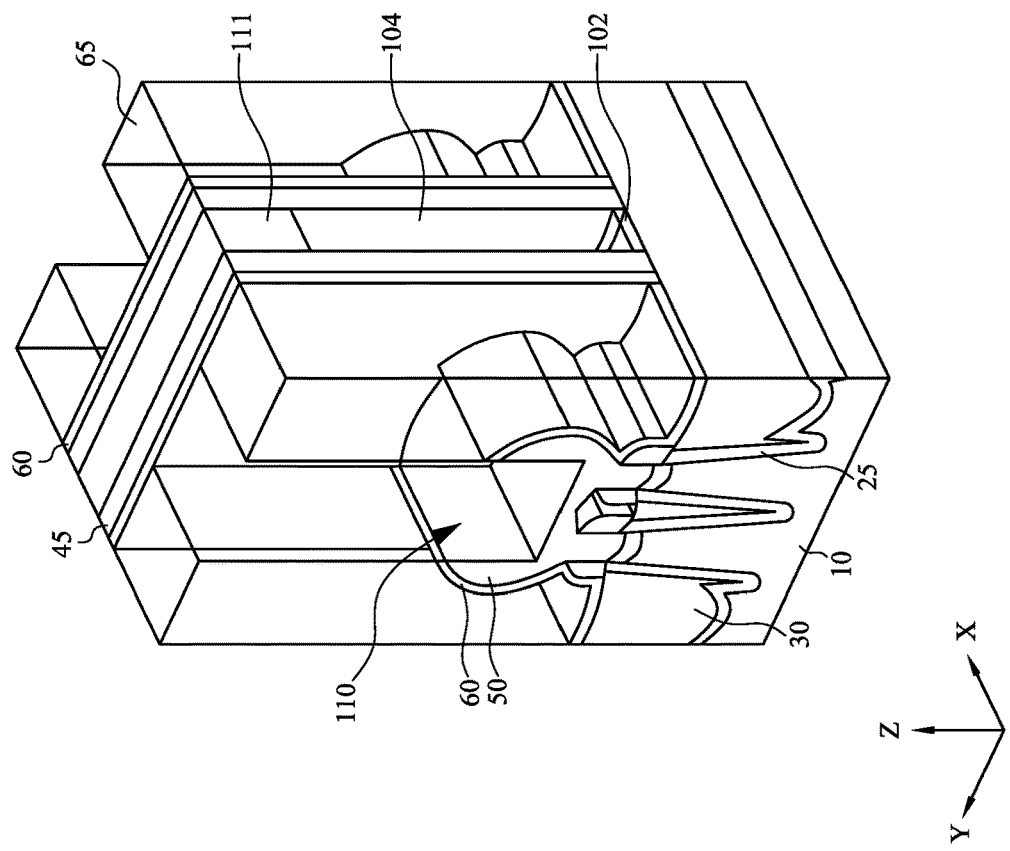
FIG. 14 shows one of the stages of a sequential process for manufacturing a FET device according to an embodiment of the present disclosure.

Subsequently, contact holes 110 are formed in the ILD layer 65 by using dry etching, as shown in FIG. 14. In some embodiments, the upper portion of the S/D epitaxial layer 50 is etched.

Figure 16:
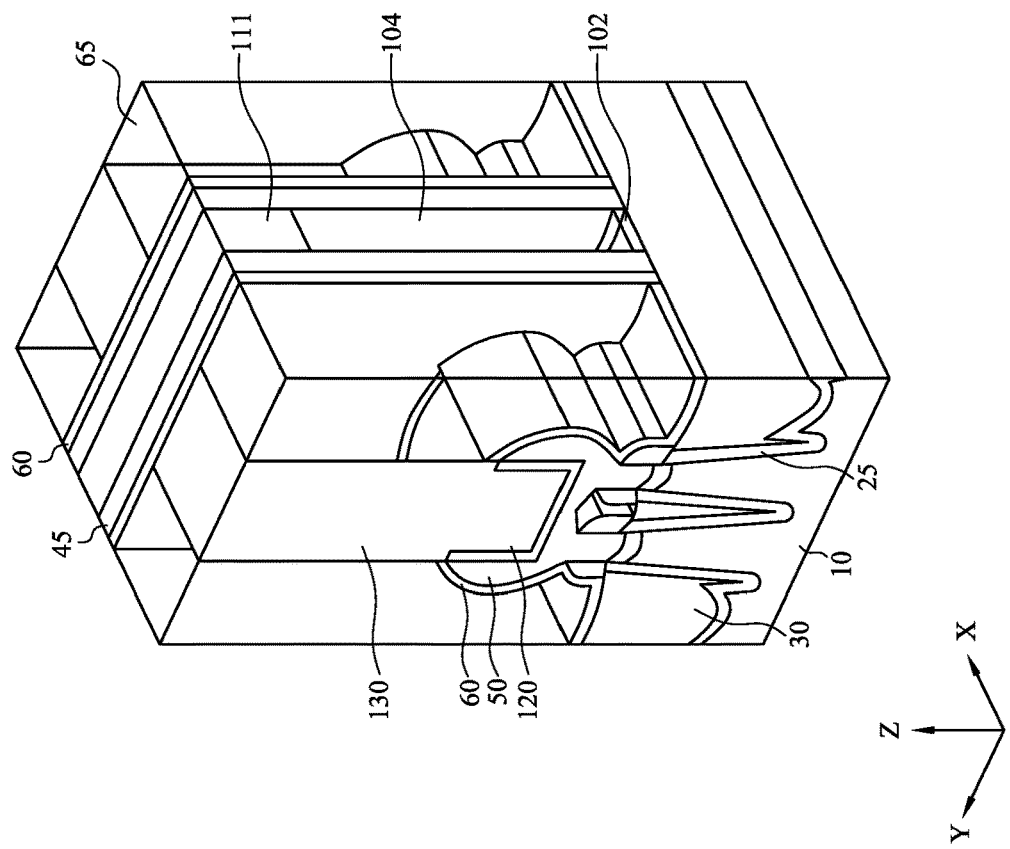
FIG. 16 shows one of the stages of a sequential process for manufacturing a FET device according to an embodiment of the present disclosure.
Figure 15:
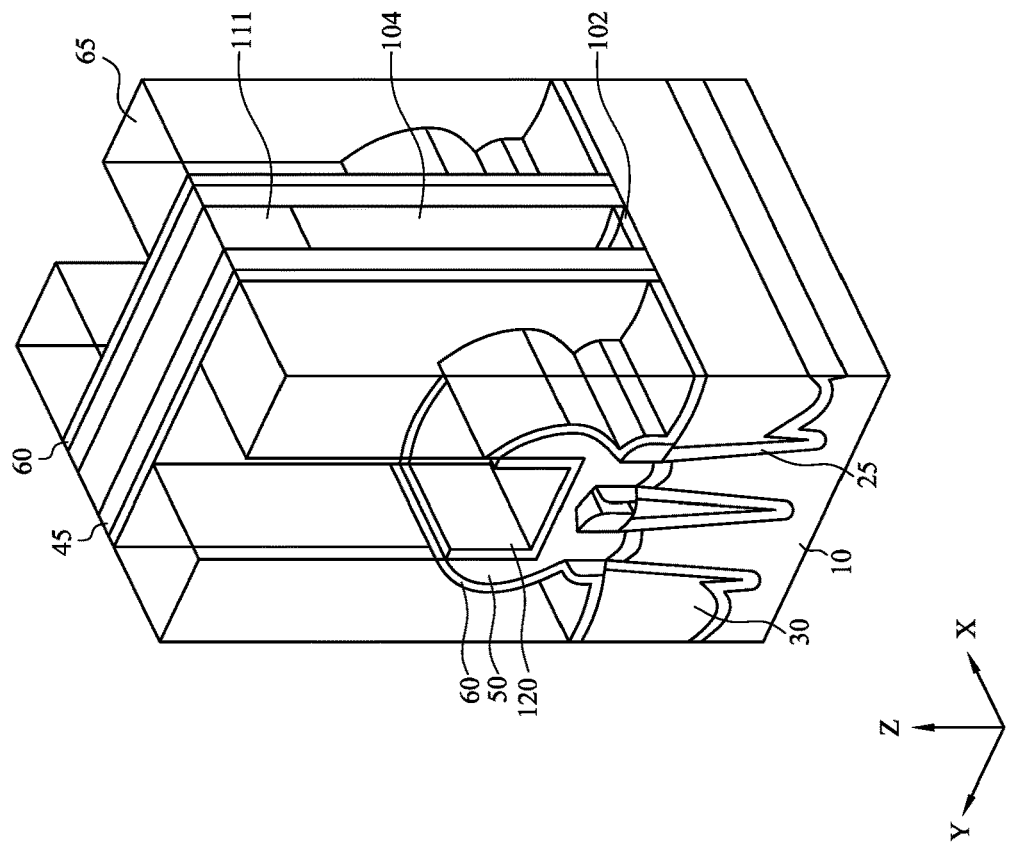
FIG. 15 shows one of the stages of a sequential process for manufacturing a FET device according to an embodiment of the present disclosure.

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16. The conductive material 130 includes one or more of Co, Ni, W, Ti, Ta, Cu, Al, TiN and TaN.

It is understood that the FinFETs undergo further CMOS processes to form various features such as contacts/vias, interconnect metal layers, dielectric layers, passivation layers, etc.

FIGS. 17A-21C show a sequential process for a gate replacement operation according to an embodiment of the present disclosure. It is understood that additional operations can be provided before, during, and after processes shown by FIGS. 17A-21C, and some of the operations described below can be replaced or eliminated, for additional embodiments of the method. The order of the operations/processes may be interchangeable.

FIGS. 17A-17D show various views after the sacrificial gate structure (sacrificial gate electrode 44 and sacrificial gate dielectric layer 42) are removed, thereby forming a gate space 49, as described with FIG. 12. FIG. 17A is a cross sectional view along X1-X1 of FIG. 17D (a plan or projected view), FIG. 17B is a cross sectional view along Y1-Y1 of FIG. 17D and FIG. 17C is a cross sectional view along Y2-Y2 of FIG. 17D. In some embodiments, an additional dielectric layer 66 is formed over the ILD layer 65. In some embodiments, the additional dielectric layer 66 includes silicon nitride.

Figure 18A:
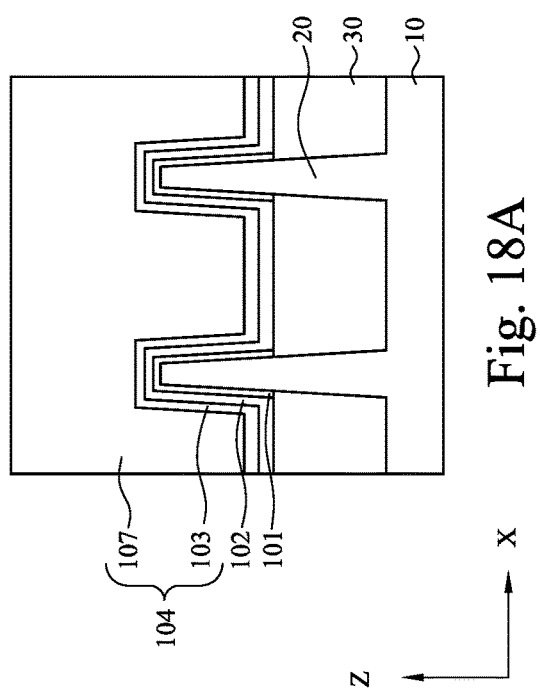
FIGS. 18A, 18B and 18C show various stages of a sequential process for a gate replacement operation according to an embodiment of the present disclosure.
Figure 18B:
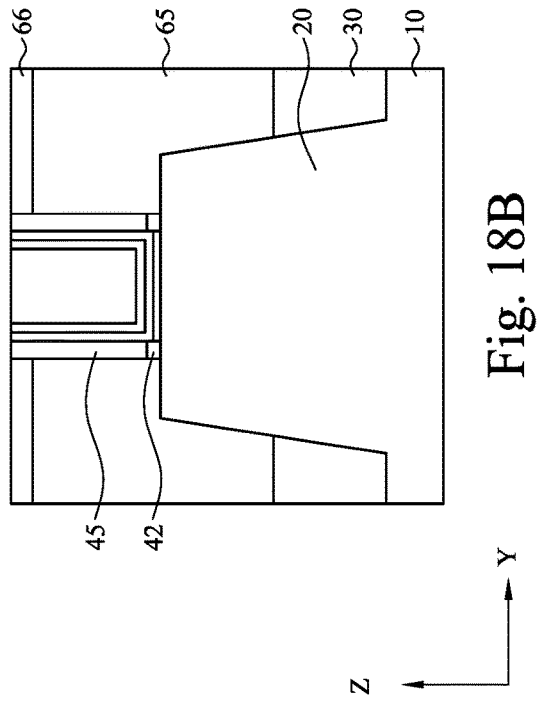
Figure 18C:
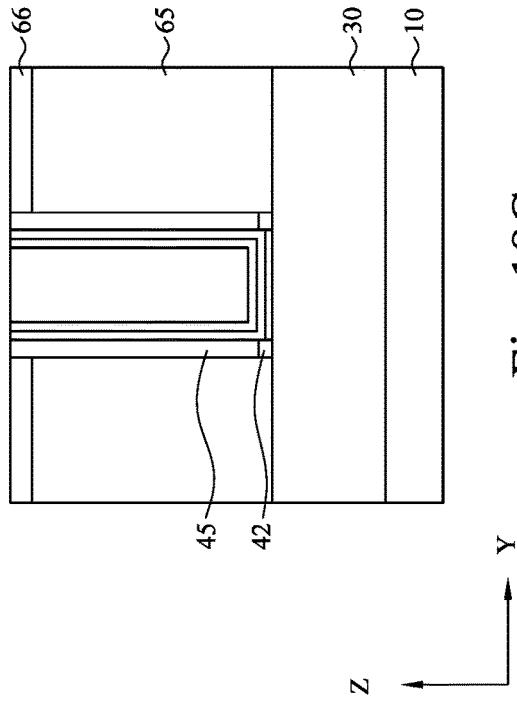

Then, as shown in FIGS. 18A-18C, an interfacial layer 101 is formed on the channel regions of the fin structures 20 and a gate dielectric layer 102 is formed over the interfacial layer and inner wall of the gate sidewall spacers 45. Then, one or more work function adjustment layers 103 are formed on the gate dielectric layer 102, and a body metal gate electrode layer 107 is formed over the work function adjustment layer 103. In some embodiments, a glue layer is formed between the work function adjustment layer and the body metal gate electrode layer 107. In some embodiments, the FinFET shown in FIGS. 18A-18C is an n-type FET and the work function adjustment layer 103 is an n-type work function adjustment layer (e.g., TiAl or TiAlC).

Figure 19B:
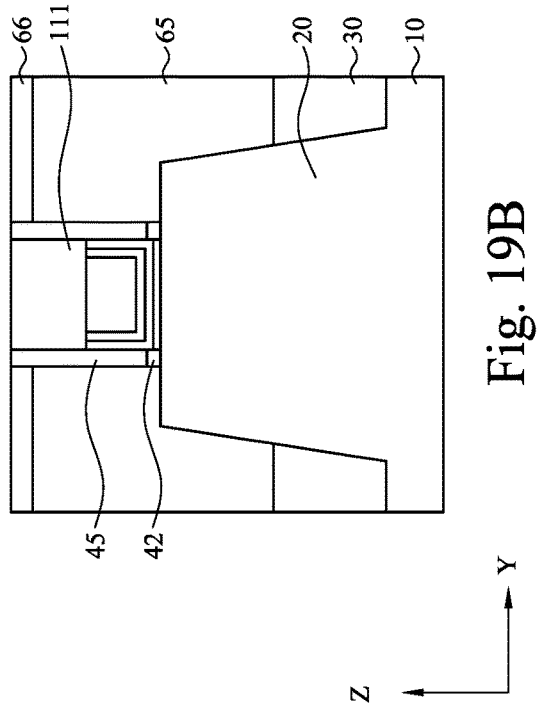
FIGS. 19A, 19B and 19C show various stages of a sequential process for a gate replacement operation according to an embodiment of the present disclosure.
Figure 19C:
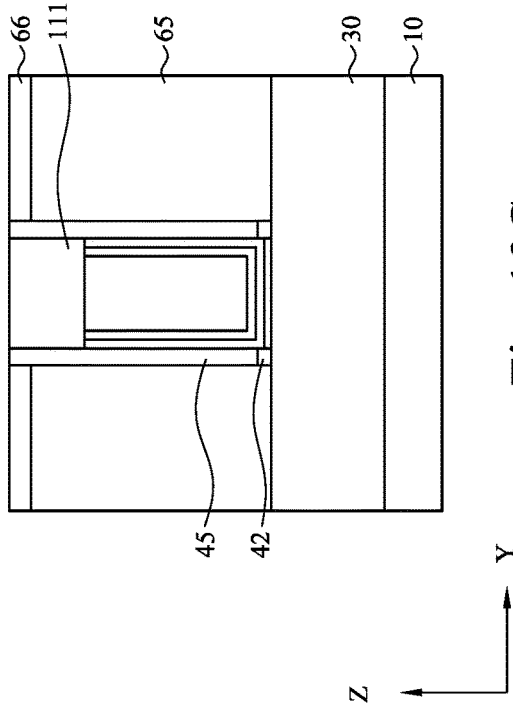
Figure 19A:
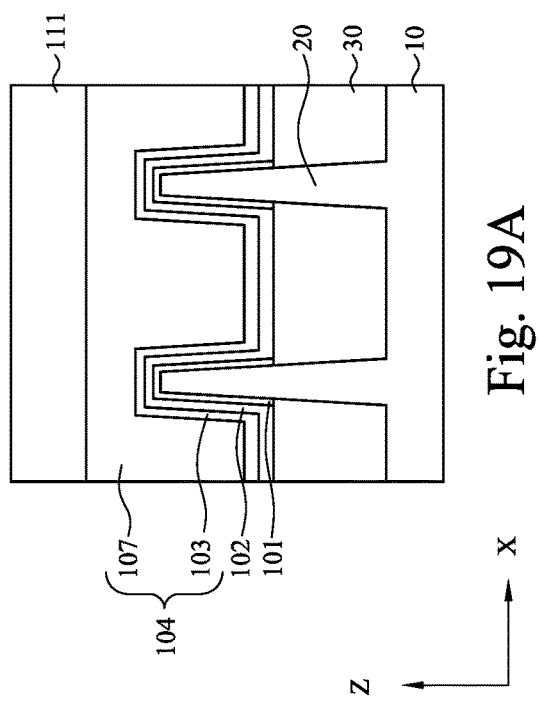
Figure 21B:
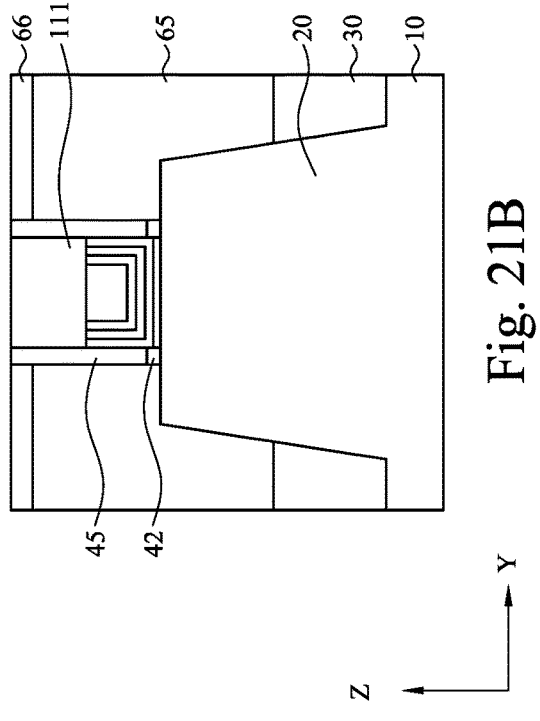
FIGS. 21A, 21B and 21C show various stages of a sequential process for a gate replacement operation according to an embodiment of the present disclosure.
Figure 21C:
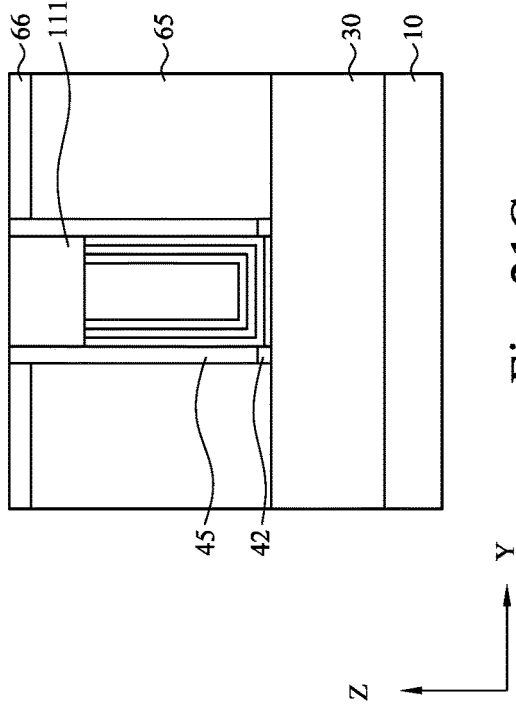
Figure 21A:
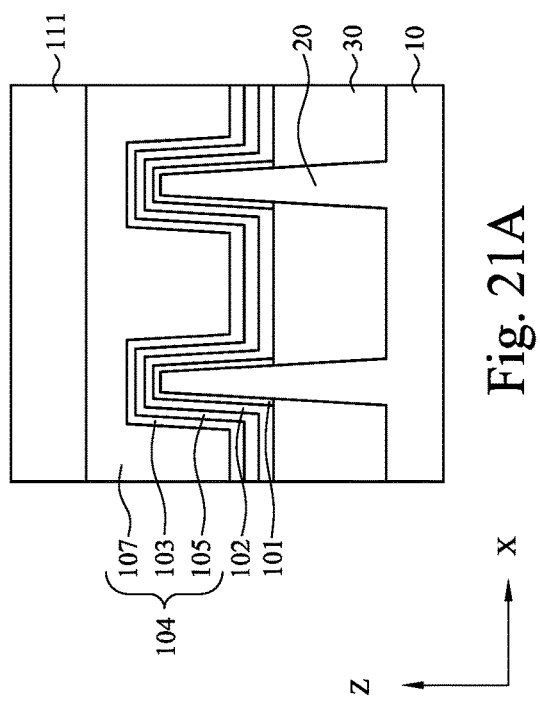

Further, as shown in FIGS. 19A-19C, the metal gate structure including the metal gate electrode 104 and the gate dielectric layer 102 are recessed down to a desired level, thereby forming a gate recess space, and the gate recess space is filled with an insulating material 111. In some embodiments, the gate cap insulating layer 111 includes silicon nitride, SiON and/or SiOCN or any other suitable material.

FIGS. 20A-20C and 21A-21C are the case for a p-type FET. In some embodiments, one or more p-type work function adjustment layers 105 (e.g., Ti, or TiN) are formed on the gate dielectric layer 102 and optionally, the n-type work function adjustment layer 103 is formed on the p-type work function adjustment layer 105. In some embodiments, a glue layer is formed between the work function adjustment layer and the body metal gate electrode layer 107.

As the device dimension decreases, a width of the gate space becomes smaller. When multiple layers are formed in the gate space, a void or a seam may be formed in the metal gate structure. When such a void or a seam is formed, various problems may occur. For example, after the metal gate structure is formed, the metal gate structure is cut (divided) into pieces of metal gate structures for respective FETs. In such a case, chemicals used in etching (dry and/or wet etching), such as KOH, HCl, HF and/or $NH_4OH$, penetrate through the void, causing undesired oxidation or contamination of one or more films of the metal gate structures. In addition, one or more chemicals used in a subsequent CMP process and/or a cleaning process also penetrate through the void or the seam. Further, a channel region (Si fin) may also be damaged by the chemicals, causing a surface damage defect. Accordingly, a method of manufacturing a metal gate structure that can avoid generation of voids and/or seams are desired.

FIGS. 22, 23, 24, 25, 26, 27 and 28A and 28B show various stages of a sequential process for a metal gate formation operation according to an embodiment of the present disclosure. It is understood that additional operations can be provided before, during, and after processes shown by FIGS. 22-28B, and some of the operations described below can be replaced or eliminated, for additional embodiments of the method. The order of the operations/processes may be interchangeable. Materials, processes, methods, configurations and/or dimensions explained with respect to the foregoing embodiments are applicable to the following embodiments, and detailed description thereof may be omitted.

Figure 22:
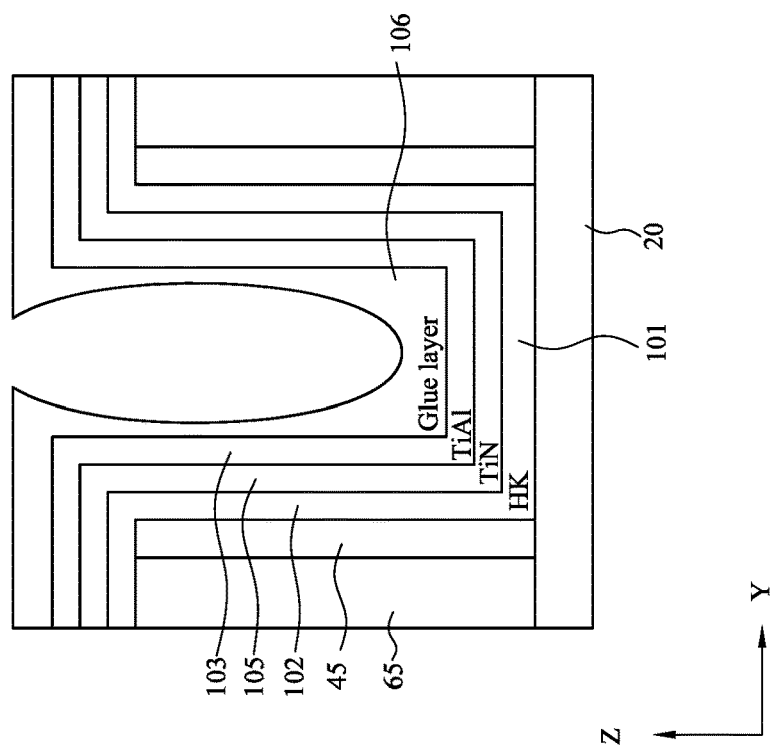

As shown in FIG. 22, one or more work function adjustment layers 103 and 105 are formed over a gate dielectric layer 102 in a gate space defined by gate sidewall spacers 45. In some embodiments, an interfacial layer 101 made of, for example, chemically formed silicon oxide, is formed on a channel region of the fin structures 20. After the work function adjustment layers are formed, a glue layer 106 is formed. In some embodiments, the glue layer 106 includes TiN having a thickness in a range from about 2 nm to about 100 nm. In some embodiments, a Ti/N atomic ratio of the TiN layer as deposited is about 0.8 to 1.0. In some embodiments, one or more of the gate dielectric layers, the work function adjustment layers and the glue layers are not conformally formed in the gate space, and thus, after the glue layer 106 is formed, an oval or seam-like shape space remains in the gate space, as shown in FIG. 22. In some embodiments, the spacer 45 is not perfectly vertical and thus, such bended spacer 45 with convex or concave shape (not shown) causes the formation of an oval or seam-like shaped space in the gate space, after the one or more of the gate dielectric layers, the work function adjustment layers and the glue layer deposited either conformally or non-conformally in the gate space. In other embodiments, the glue layer 106 includes TaN, TiSiN and/or Co. In some embodiments, a barrier layer including TiN, or TaN is formed before forming the glue layer 106.

Figure 23:
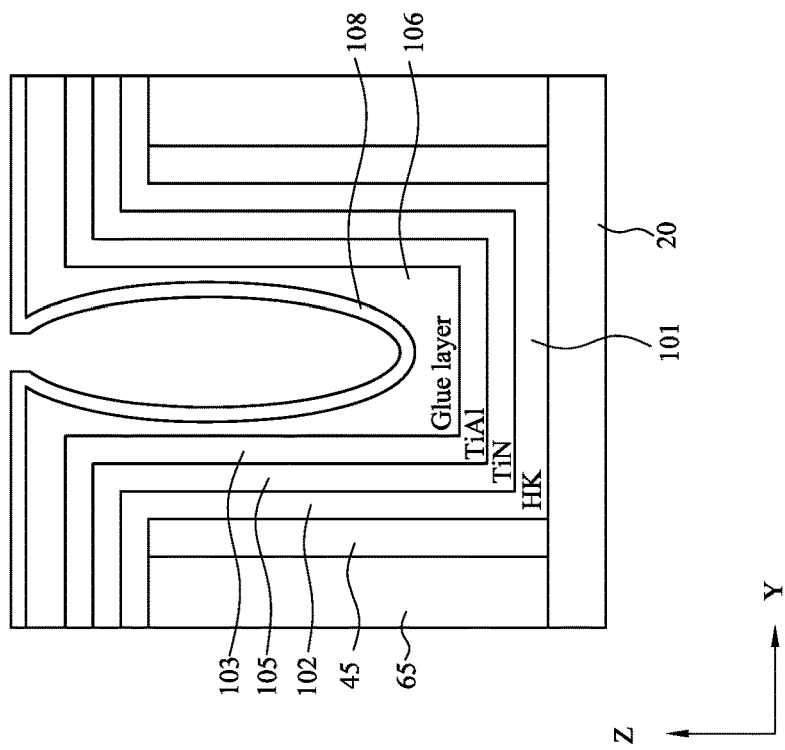
FIGS. 22, 23, 24, 25, 26, 27 and 28A and 28B show various stages of a sequential process for a metal gate formation operation according to an embodiment of the present disclosure.

Then, a seed layer 108 (nucleation layer) for a subsequent W layer is formed on the glue layer 106 as shown in FIG. 23. In some embodiments, the seed layer as deposited includes W formed by CVD or ALD. In some embodiments, the seed layer is a pure (non-doped) W layer, a W layer containing (doped with) B or a W layer containing Si, or a W layer containing Si and B. The source gas for the deposition includes one or more of $WCl_5$ or $WF_6$, one or more of silicon source gases (e.g., $SiH_4$, $Si_2H_6$ and/or $SiH_2Cl_2$, etc.), and one or more boron source gas (e.g., $B_2H_6$). In some embodiments, the thickness of the seed layer 108 is in a range from about 0.5 nm to about 10 nm and is in a range from about 1 nm to about 5 nm in other embodiments.

After the seed layer 108 is formed, an upper portion of the seed layer 108 is converted to a treated seed layer 109 by one or more ion implantation treatment, a plasma treatment or free radical treatment. By the treatment 115, the nucleation property of the seed layer is decreased to have a lower deposition rate than the non-treated portion of the seed layer 108.

In some embodiments, the treated layer 109 is formed by one or more ion implantation processes to introduce one or more ions of nitrogen, oxygen or fluorine. In some embodiments, the ion implantation process utilizes a tilted ion implantation so that the ions do not reach the bottom of the seed layer 108. In some embodiments, the ions are implanted to the upper horizontal portion deposited on the upper surface of the glue layer 106 above the sidewall spacers 45 and the substantially vertical side portions of the seed layer 108. The tilt angle of the ion implantation is adjusted between about 10 degrees to 70 degrees with respect to the normal line of the substrate in some embodiments, and is in a range from about 30 degrees to 60 degrees in other embodiments. If the tilt angle is smaller than these ranges, the ions may reach the bottom of the gate space. If the tilt angle is larger than these ranges, only the upper portion of the seed layer is treated, and the subsequent W growth may undesirably occur at a higher position causing a void or a seam. In some embodiments, the ions are also implanted to an upper surface of the glue layer 106 to form treated glue layer 106A. In some embodiments, the implantation energy is in a range from about 100 eV to about 20 keV and is in a range from about 1 keV to 10 keV in other embodiments. In some embodiments, the implantation dose is in a range from about $1.0 \times 10^{12}$ ions/cm$^2$ and $5 \times 10^{15}$ ions/cm$^2$.

In some embodiments, the treated layer 109 is formed by a plasma treatment to introduce one or more ions or radicals of nitrogen, oxygen or fluorine. In some embodiments, a source gas of the plasma includes one or more of an oxygen source gas (e.g., $O_2$), a nitrogen source gas (e.g., $N_2$ or $NH_3$) and/or a fluorine source gas (e.g., $CF_4$, $CH_3F$, $SF_6$ and/or $NF_3$). In some embodiments, the ions are implanted to the upper horizontal portion deposited on the upper surface of the glue layer above the sidewall spacers 45 and vertical side portions of the seed layer 108. In some embodiments, the ions are also introduced into an upper surface of the glue layer 106. The plasma treatment (e.g., RF plasma, capacitor coupled plasma, induction coupled plasma, or microwave plasma) is performed with input power of about 0.2 kW to about 10 kW in some embodiments.

In some embodiments, the treated layer 109 is formed by a free radical treatment to introduce one or more neutral radicals of nitrogen, oxygen or fluorine. In some embodiments, a remote plasma source is used together with an ion filter, to generate the neutral radicals. In some embodiments, the source gas of the remote plasma includes one or more of an oxygen source gas (e.g., $O_2$), a nitrogen source gas (e.g., $N_2$ or $NH_3$) and/or a fluorine source gas (e.g., $CF_4$, $CH_3F$, $SF_6$ and/or $NF_3$). In some embodiments, the ions are implanted to the upper horizontal portion deposited on the upper surface of the glue layer above the sidewall spacers 45 and upper vertical side portions of the seed layer. In some embodiments, the ions are also introduced into an upper surface of the glue layer 106.

Figure 24:
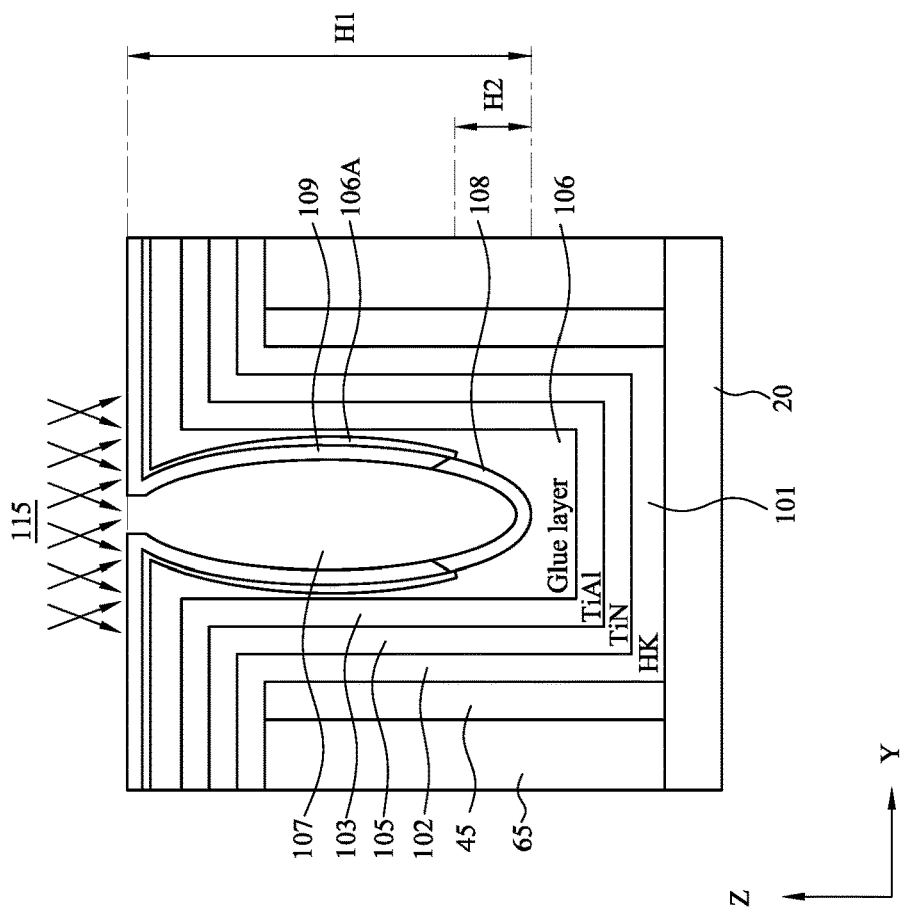

After the treatment, the upper portion of the seed layer (treated layer 109) is a W layer containing O, N and/or F, or a W layer containing Si and/or B and O, N and/or F, while the bottom portion does not contain O, N and/or F (less than detectable amount). In some embodiments, a concentration of O, N, and/or F in the treated layer 109 is in a range from about 2 atomic % to 56 atomic %. In some embodiments, the height H2 of the non-treated seed layer 108 is about 5% to about 30% of the vertical dimension H1 (from the bottom to the top) of the entire glue layer, as shown in FIG. 24 (i.e., the treated portion is about 70% to about 95% of H1). In other embodiments, the height H2 is about 10% to about 20% of the height H1 (i.e., the treated portion is about 80% to about 90% of H1).

Figure 25:
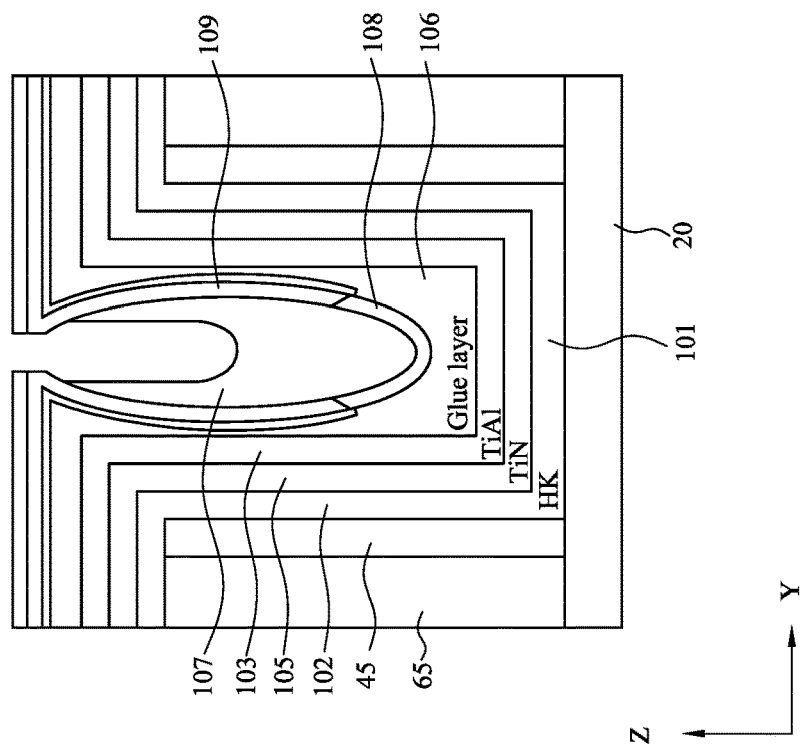
Figure 26:
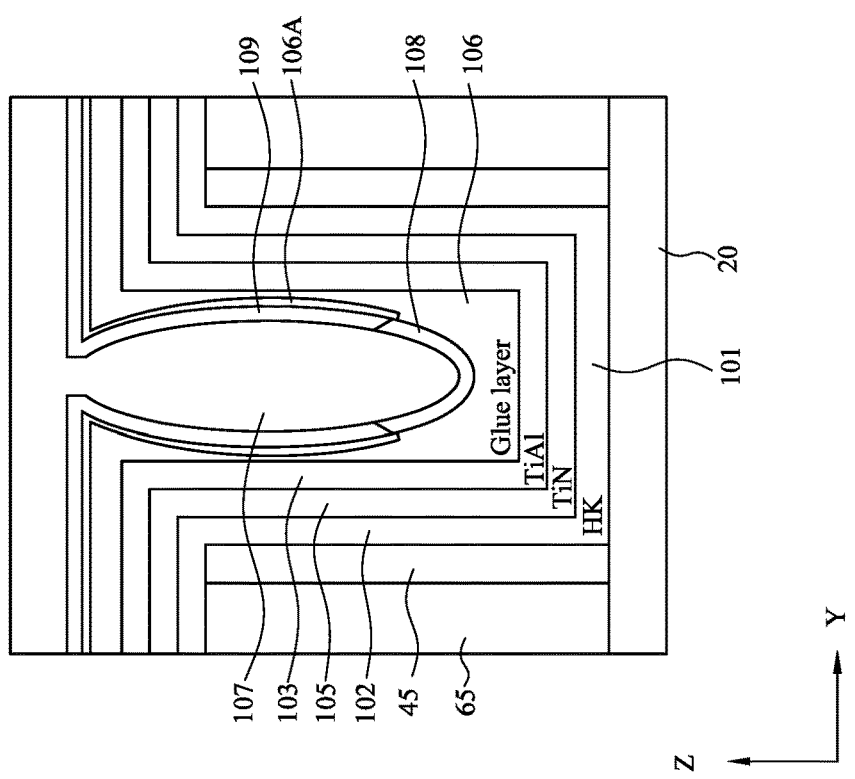

Then, a body metal layer 107, such as a W layer (doped or non-doped) is formed over the seed layer 108 and the treated layer 109. As set forth above, the treated layer 109 has a lower or no nucleation property for W deposition, and the W layer is selectively grown from the non-treated seed layer 108 in a bottom-up manner, as shown in FIG. 25. The W deposition continues to fully fill the oval space of the gate space as shown in FIG. 26. Since the growth of W is suppressed at the top horizontal portion and the corner portions of the oval space, the W layer can selectively nucleate and deposit at the bottom portion first and thus the W layer can fully fill the oval space without forming a void or a seam. The W layer is formed by CVD or ALD using one or more of $WCl_5$ or $WF_6$. When $WCl_5$ is used, the W layer is free from fluorine.

In some embodiments, as set forth above, the implanted or introduced ions/radicals reach a part of the glue layer 106 to form treated glue layer 106A, thereby changing composition of the treated glue layer 106A. In some embodiments, when the non-treated glue layer 106 is TiN and nitrogen is introduced, the Ti/N atomic ratio of the treated glue layer 106A is in a range from about 1.1 to about 2.0, and is in a range from about 1.3 to about 1.5 in other embodiments.

Figure 27:
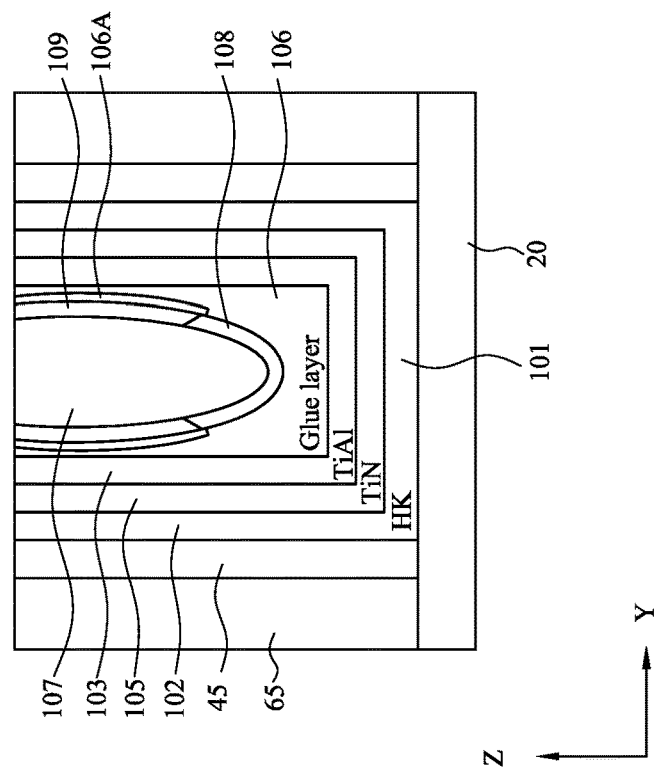

After the body metal layer 107 is formed, the gate dielectric layer 102, the work function adjustment layers 103, 105, the glue layer 106, the treated layer 109 and the body metal layer 107 formed over the gate sidewall spacers 45 and the ILD layer are then planarized by using, for example, CMP, until the top surface of the gate sidewall spacers and the ILD layer is revealed, as shown in FIG. 27.

Figure 28B:
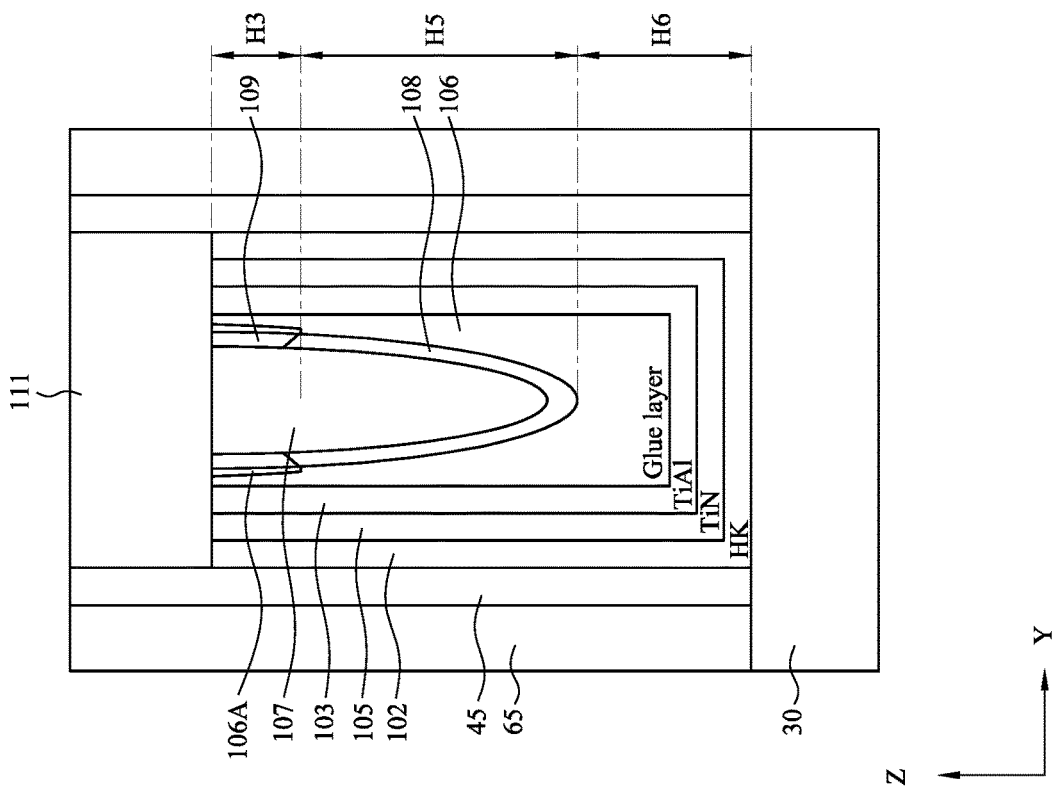
Figure 28A:
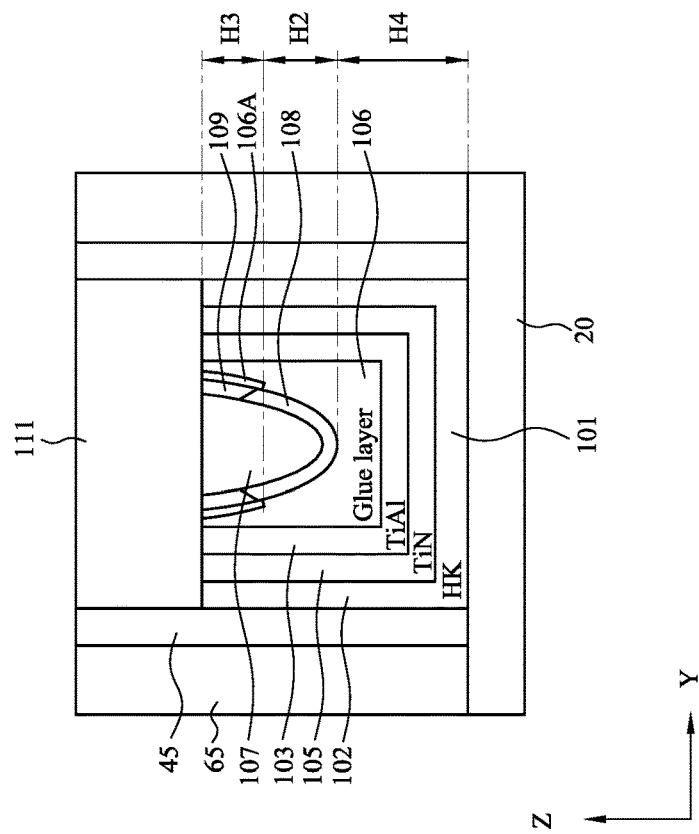

After the planarization operation, the gate dielectric layer 102, the work function adjustment layers 103, 105, the glue layer 106, the treated layer 109 and the body metal layer 107 are recessed, and a cap insulating layer 111 is formed over the recessed gate electrode, as shown in FIGS. 28A and 28B. FIG. 28A is a cross section cutting the channel region and FIG. 28B shows a cross section over the isolation insulating layer 30. The cap insulating layer includes one or more layers of a silicon nitride-based material, such as SiN. The cap insulating layer 111 can be formed by depositing an insulating material followed by a planarization operation.

In some embodiments, as shown in FIG. 28A, the treated layer 109 remains under the cap insulating layer 111. In some embodiments, the vertical height H3 of the treated layer 109 is smaller than the vertical height H2 of the non-treated seed layer 108, and is in a range from about 10% to 80% of the vertical height H2. In other embodiments, the vertical height H3 is in a range from about 20% to about 50% of the vertical height H2. In other embodiments, the vertical height H3 is less than about 10% of the total vertical height (more than zero) of the treated layer 109 and non-treated layer 108. In certain embodiments, no treated layer 109 remains. In some embodiments, the distance H4 between the top of the channel region of the fin structure 20 to the bottom of the non-treated seed layer 108 is in a range from about 10 nm to about 30 nm.

In some embodiments, as shown in FIG. 28B, when the treated layer 109 remains under the cap insulating layer 111, the vertical height H3 of the treated layer 109 is smaller than the vertical height H5 of the non-treated seed layer 108 (deepest distance), and is in a range from about 5% to 70% of the vertical height H5. In other embodiments, the vertical height H3 is in a range from about 10% to about 40% of the vertical height H5. In other embodiments, the vertical height H3 is less than about 5% of the vertical height (more than zero). In certain embodiments, no treated layer 109 remains. In some embodiments, the distance H6 between the top of the isolation insulating layer 30 to the bottom of the non-treated seed layer 108 is in a range from about 10 nm to about 240 nm.

FIGS. 29A, 29B, 29C, 29D, 29E, 29F, 29G and 29H show various stages of a sequential process for manufacturing a semiconductor device according to an embodiment of the present disclosure. It is understood that additional operations can be provided before, during, and after processes shown by FIGS. 29A-29H, and some of the operations described below can be replaced or eliminated, for additional embodiments of the method. The order of the operations/processes may be interchangeable. Materials, processes, methods, configurations and/or dimensions explained with respect to the foregoing embodiments are applicable to the following embodiments, and detailed description thereof may be omitted. In the following embodiments, after the metal gate structure is formed, no cap insulating layer is formed.

Figure 29A:
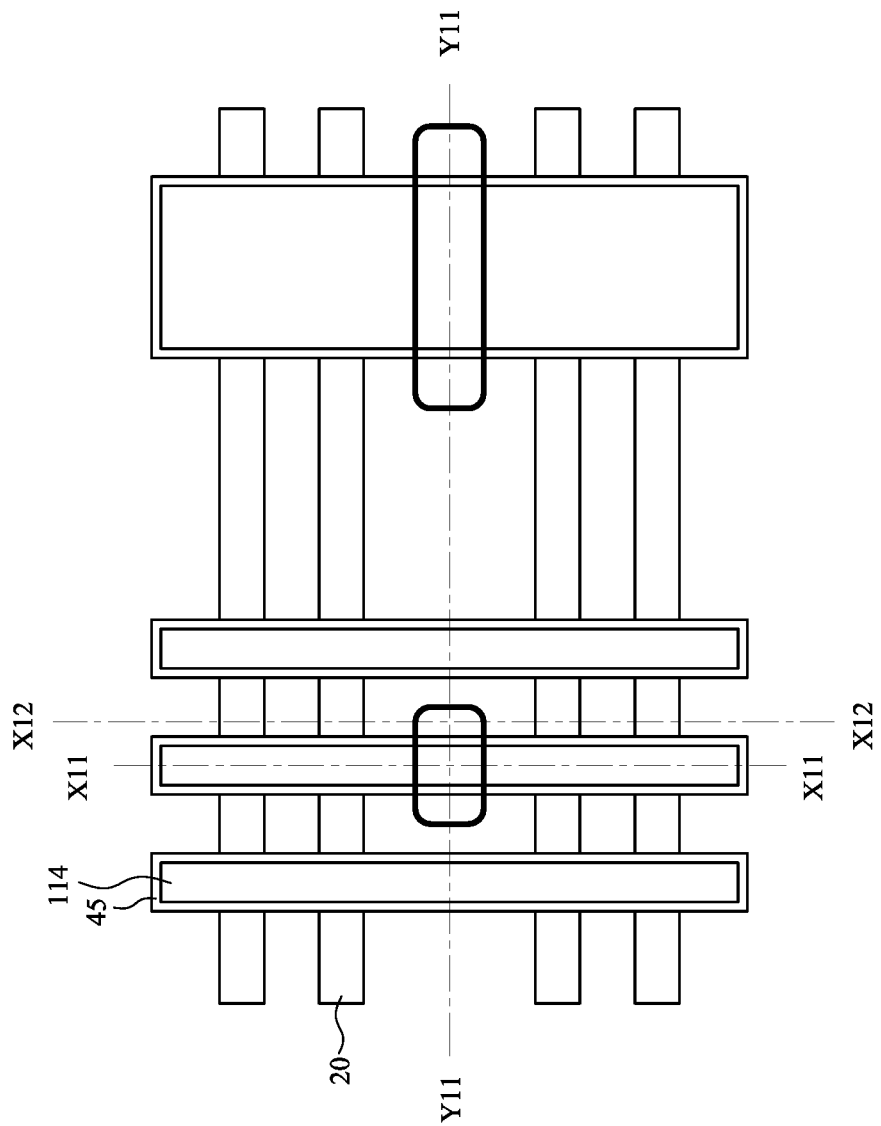
FIGS. 29A, 29B, 29C, 29D, 29E, 29F, 29G and 29H show various stages of a sequential process for manufacturing a semiconductor device according to an embodiment of the present disclosure.
Figure 29B:
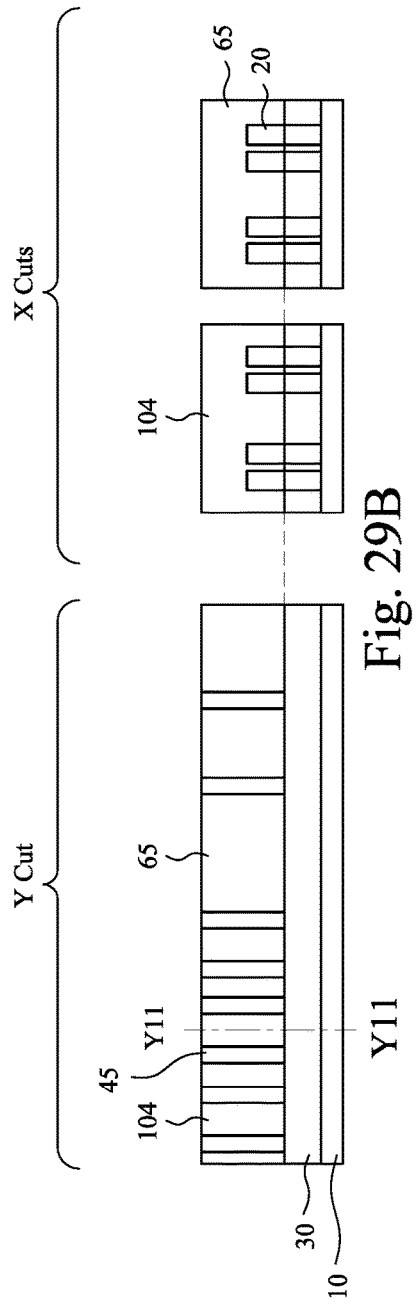

FIGS. 29A and 29B show the structure after the conductive layers for the gate structure are formed similar to FIGS. 18A-18C and 20A-20C. FIG. 29A is a plan view and FIG. 29B shows cross sectional views along Y11-Y11 (Y cut) and X11-X11 and X12-X12 (X cuts) of FIG. 29A. In some embodiments, gate structures have different gate length as shown in FIGS. 29A and 29B. In some embodiments, a long gate structure is formed over multiple fin structures, which is subsequently divided into two or more pieces for respective FETs.

Figure 29C:
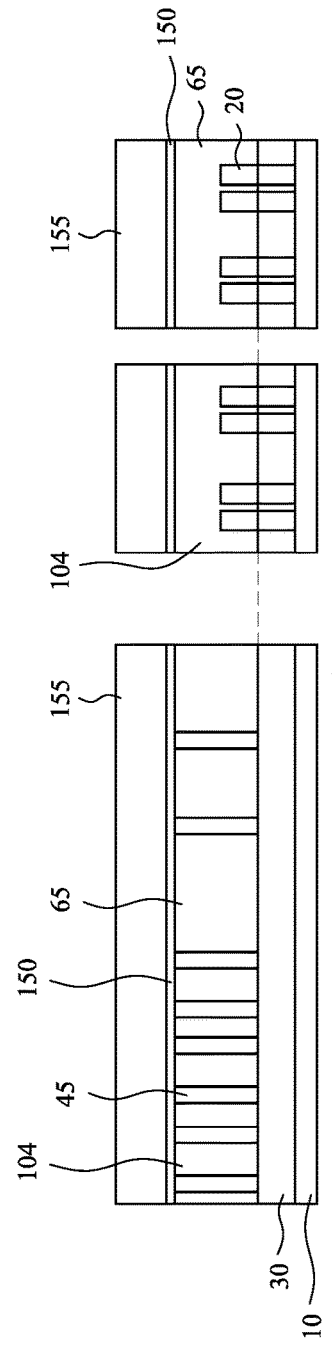

As shown in FIG. 29C, an etch stop layer or a CMP stop layer 150 is formed over the gate structures and the ILD layer 65 and then a hard mask layer 155 is formed over the stop layer 150. In some embodiments, the stop layer 150 is made of TiN having a thickness in a range from about 3 nm to about 10 nm, and the hard mask layer 155 is made of silicon nitride having a thickness in a range from about 30 nm to about 100 nm.

Figure 29D:
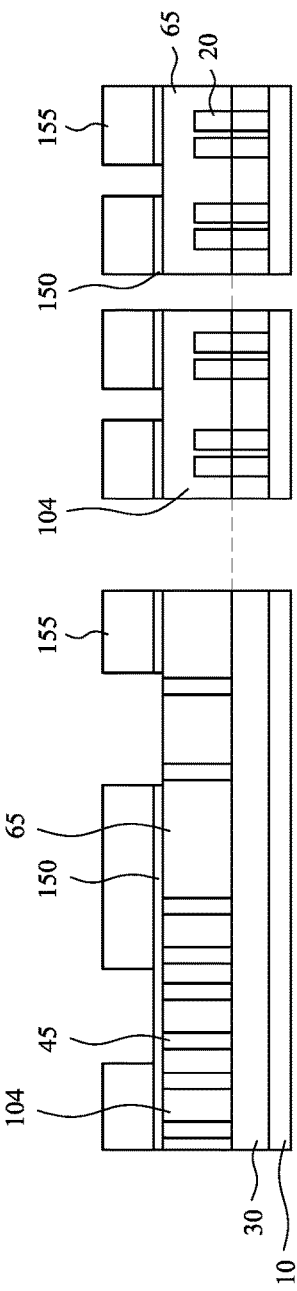

Then, as shown in FIG. 29D, the hard mask layer 155 is patterned by one or more lithography and etching operations to form gate-cut openings.

Figure 29E:
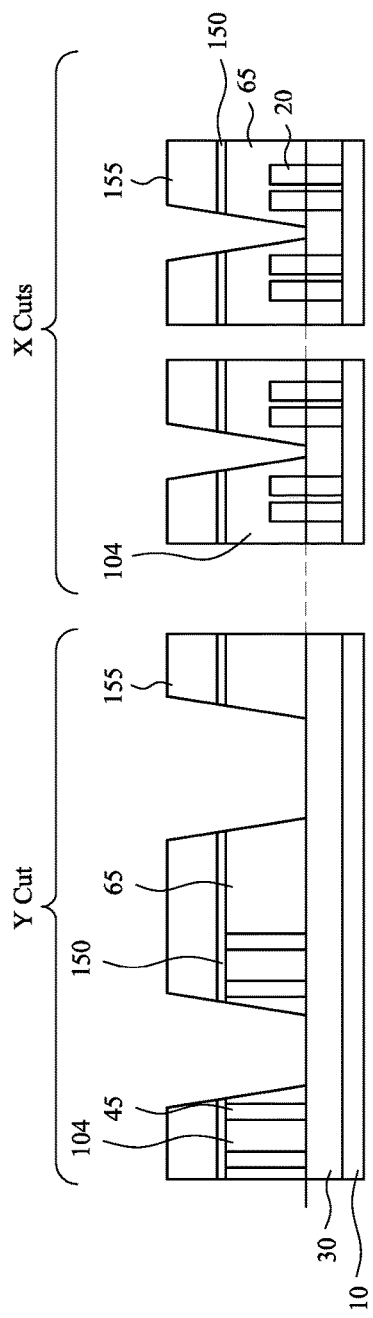
Figure 29F:
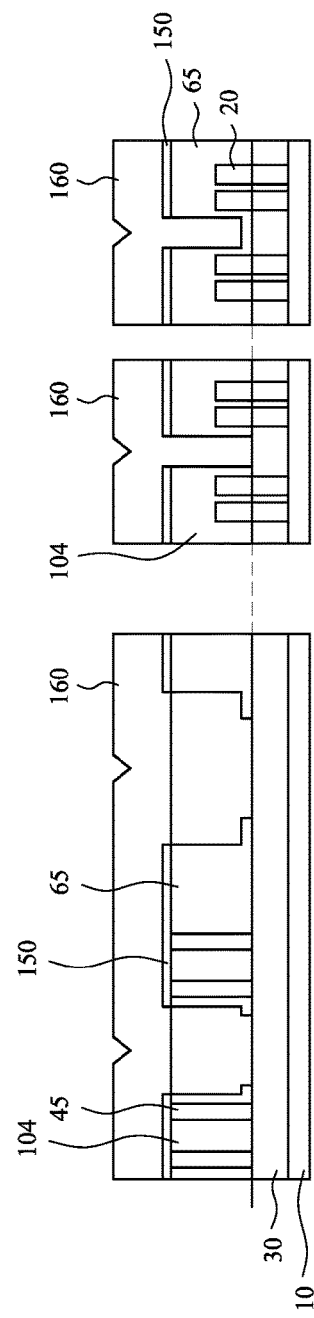
Figure 29G:
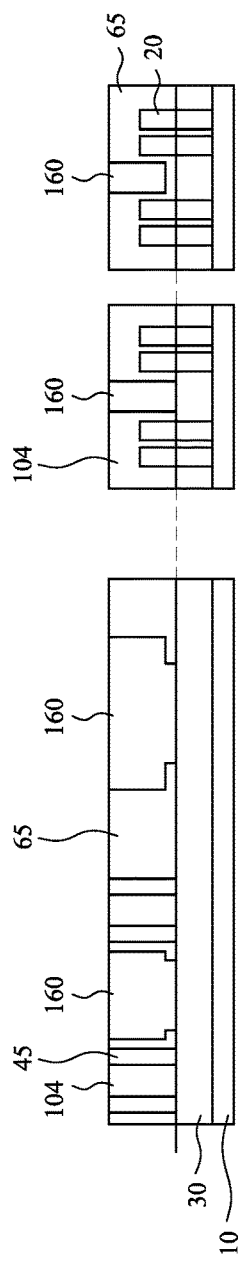
Figure 29H:
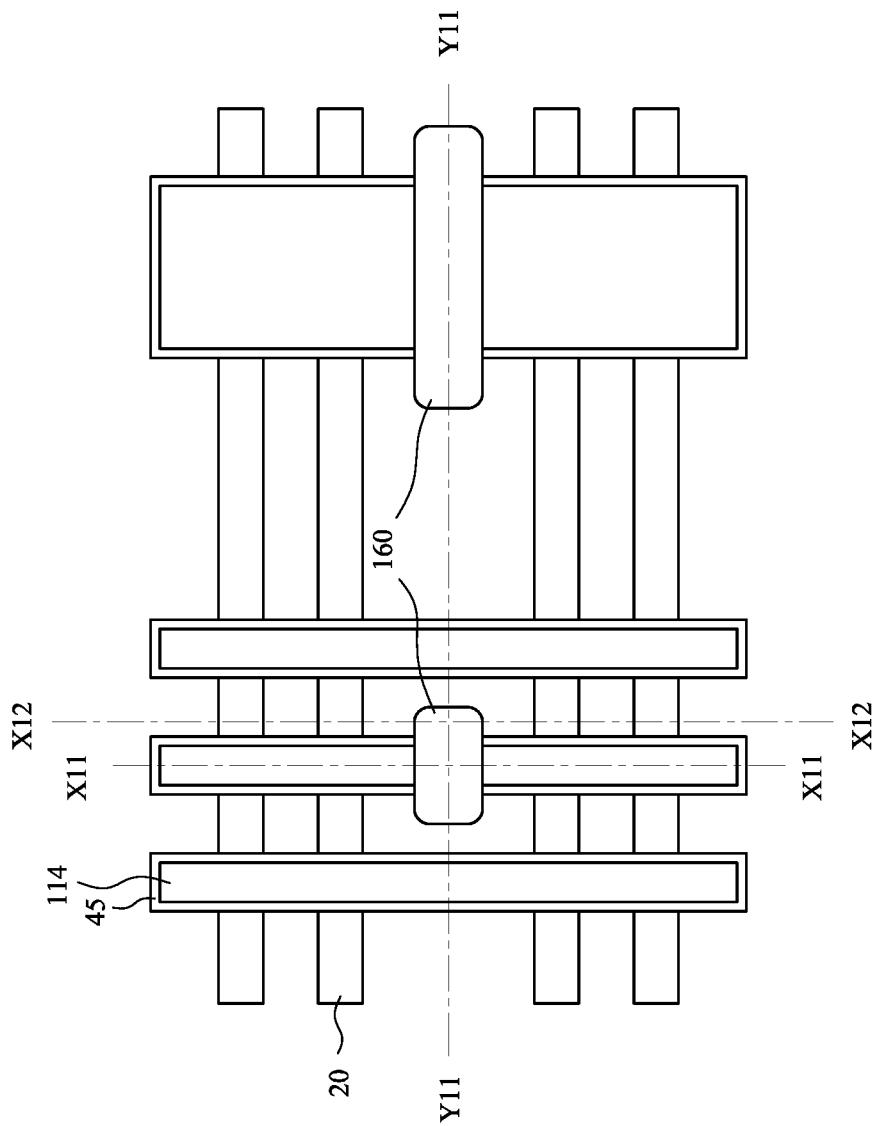

Next, as shown in FIG. 29E, one or more long gate structures are cut into pieces. Subsequently, a filling dielectric layer 160 is formed as shown in FIG. 29F followed by a planarization operation, such as a CMP operation, is performed to form a separation plug 160 separating two metal gate structures, as shown in FIGS. 29G and 29H. In some embodiments, during the CMP operation, the gate structures are also etched to reduce the height. In some embodiments, the top of the metal gate structure 104 from the top of the channel fin structure 20 is in a range from about 10 nm to about 30 nm.

FIGS. 30A, 30B, 31A, 31B, 32A and 32B show various stages of a sequential process for manufacturing a semiconductor device according to an embodiment of the present disclosure. It is understood that additional operations can be provided before, during, and after processes shown by FIGS. 30A-32B, and some of the operations described below can be replaced or eliminated, for additional embodiments of the method. The order of the operations/processes may be interchangeable. Materials, processes, methods, configurations and/or dimensions explained with respect to the foregoing embodiments are applicable to the following embodiments, and detailed description thereof may be omitted. In the following embodiments, after the metal gate structure is formed, no cap insulating layer is formed.

Figure 30B:
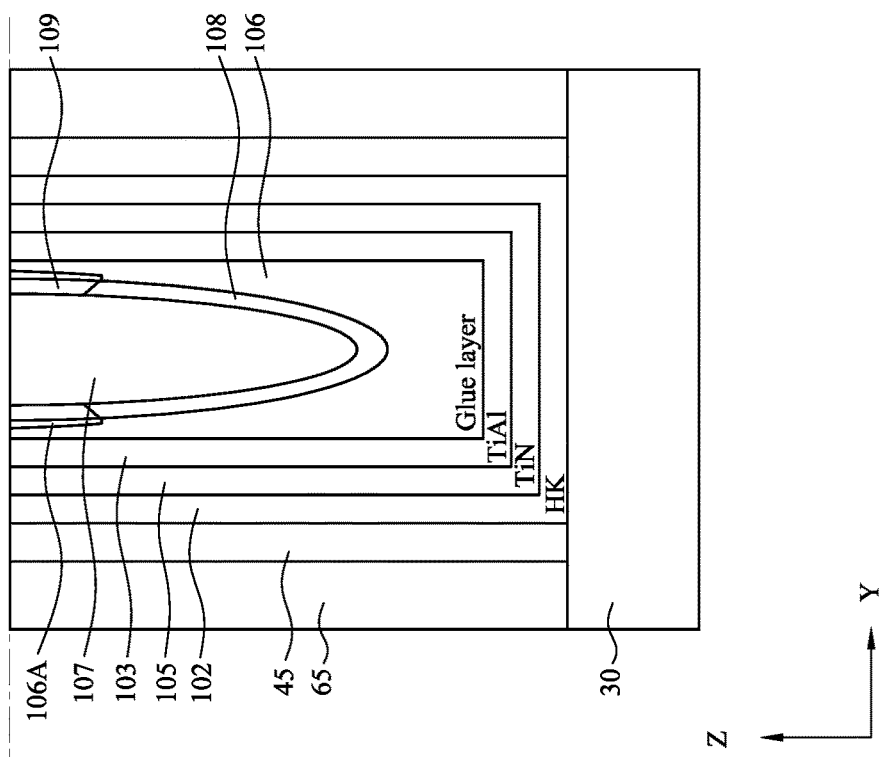
FIGS. 30A and 30B show one of the various stages of a sequential process for manufacturing a semiconductor device according to an embodiment of the present disclosure.
Figure 30A:
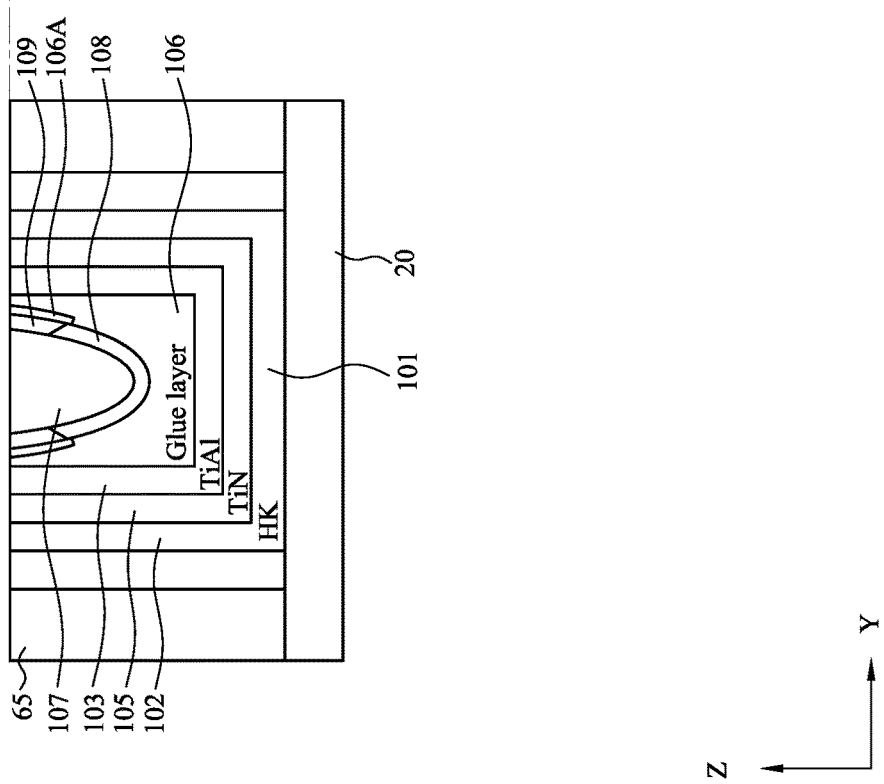

FIGS. 30A and 30B shows cross sectional views of the gate structures after the CMP operation as shown in FIGS. 29G and 29H. FIG. 30A shows a cross sectional view over the channel fin structure 20 and FIG. 30B shows a cross sectional view over the isolation insulating layer 30.

Figure 31B:
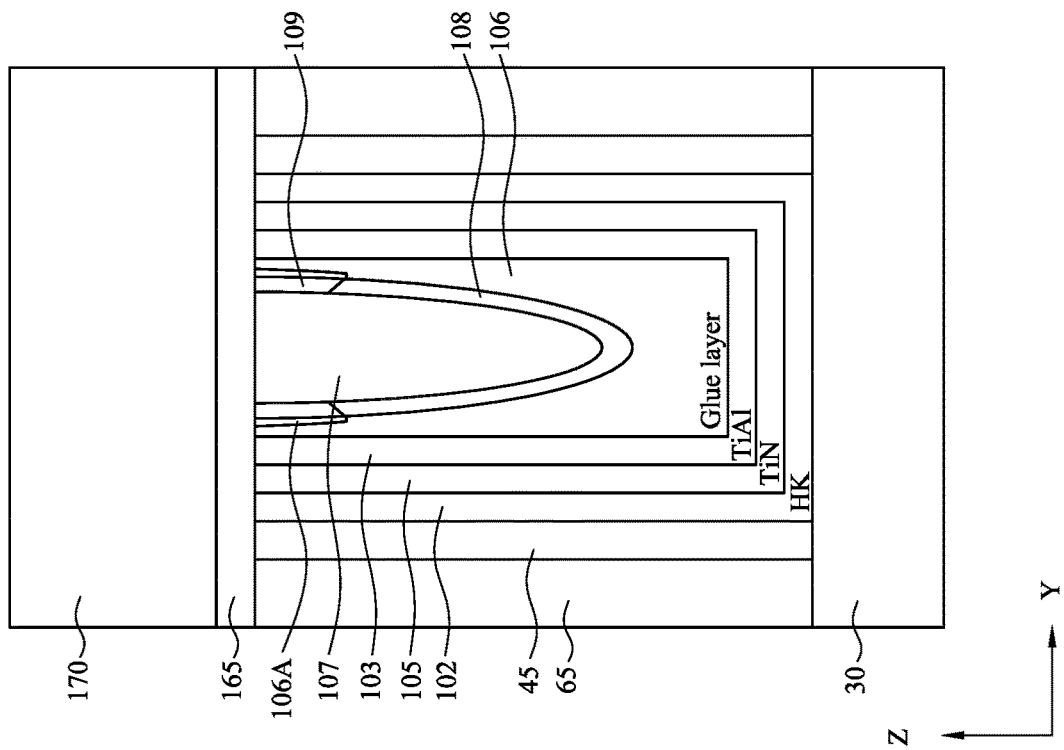
FIGS. 31A and 31B show one of the various stages of a sequential process for manufacturing a semiconductor device according to an embodiment of the present disclosure.
Figure 31A:
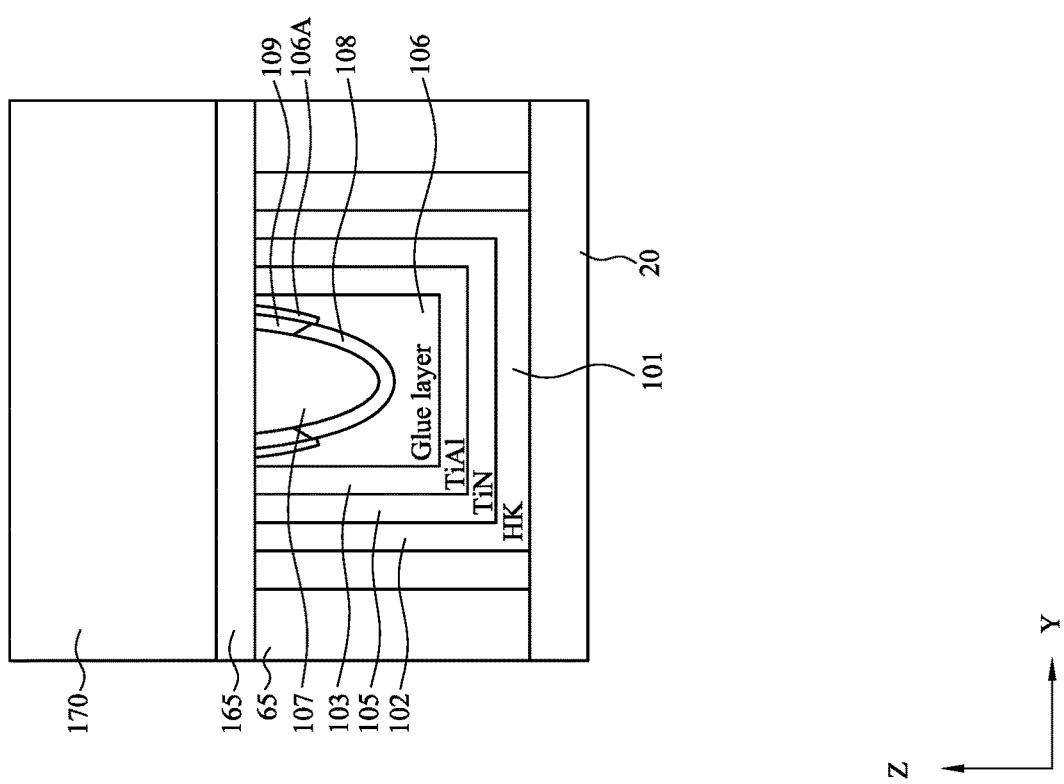

As shown in FIGS. 31A and 31B, an etch stop layer 165 is formed over the gate structures and the ILD layer 65 and then a second ILD layer 170 is formed over the etch stop layer 165. In some embodiments, the etch stop layer 165 is made of silicon nitride having a thickness in a range from about 3 nm to about 20 nm, and the second ILD layer 170 is made of silicon oxide, SiOC, SiOCN or other suitable material.

Figure 32B:
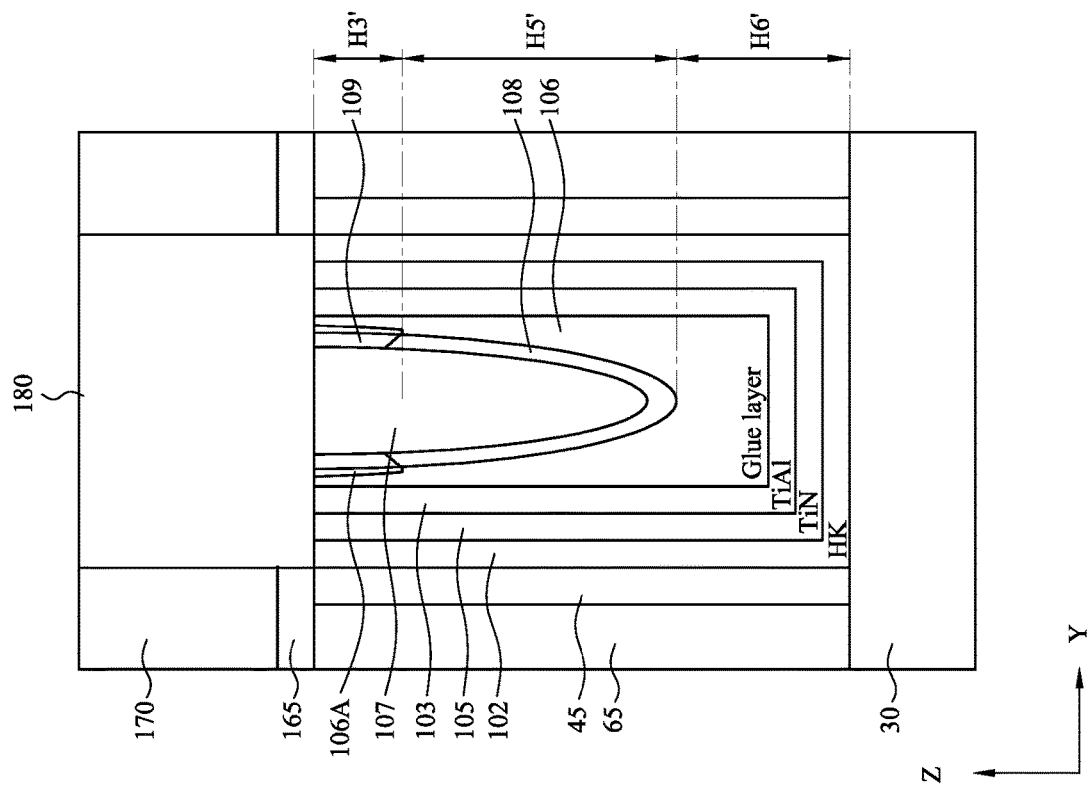
FIGS. 32A and 32B show one of the various stages of a sequential process for manufacturing a semiconductor device according to an embodiment of the present disclosure.
Figure 32A:
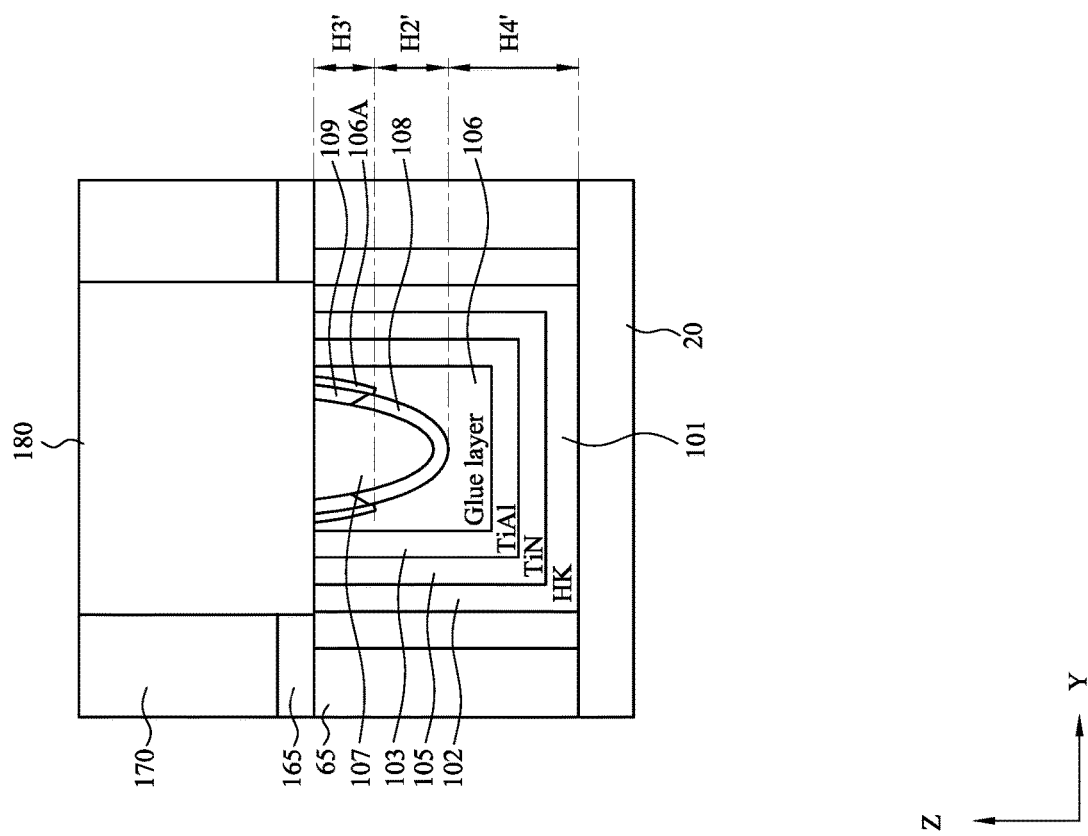

Then, a contact opening is formed by one or more lithography and etching operation over the gate structure, and the contact opening is filled with a conductive material 180 as shown in FIGS. 32A and 32B. In some embodiments, the conductive material 180 includes one or more of Ni, Co, W, Cu, Al, Ru or Mo (not alloy) and an alloy thereof.

In some embodiments, as shown in FIGS. 32A and 32B, the treated layer 109 remains under the conductive contact layer 180. In some embodiments, the vertical height H3' of the treated layer 109 is smaller than the vertical height H2' of the non-treated seed layer 108, and is in a range from about 10% to 80% of the vertical height H2'. In other embodiments, the vertical height H3' is in a range from about 20% to about 50% of the vertical height H2'. In other embodiments, the vertical height H3' is less than about 10% of the total vertical height (more than zero) of the treated layer 109 and non-treated layer 108. In certain embodiments, no treated layer 109 remains. In some embodiments, the distance H4' between the top of the channel region of the fin structure 20 to the bottom of the non-treated seed layer 108 is in a range from about 10 nm to about 30 nm.

In some embodiments, as shown in FIG. 32B, when the treated layer 109 remains under the conductive contact layer 180, the vertical height H3' of the treated layer 109 is smaller than the vertical height H5' of the non-treated seed layer 108 (deepest distance), and is in a range from about 5% to 70% of the vertical height H5'. In other embodiments, the vertical height H3' is in a range from about 10% to about 40% of the vertical height H5'. In other embodiments, the vertical height H3' is less than about 5% of the vertical height (more than zero). In certain embodiments, no treated layer 109 remains. In some embodiments, the distance H6' between the top of the isolation insulating layer 30 to the bottom of the non-treated seed layer 108 is in a range from about 10 nm to about 240 nm.

The various embodiments or examples described herein offer several advantages over the existing art. In the embodiments of the present disclosure, the seed layer includes treated portions and the W layer is selectively grown on the non-treated seed layer, which can insure bottom-up filling and avoid or suppress a void or a seam in the metal gate structure. Since no seam or no void is formed in the metal gate structure, it is possible to avoid or suppress damage on the channel region of the fin structure in subsequent processes (e.g., CMP, etching, and/or cleaning). Therefore, substantially no contaminants are present in the metal gate layers from the etching or cleaning or CMP chemicals.

Although the foregoing embodiments describe a FinFET, the disclosed technologies can be applied to other FETs, such as a planar FET and a gate-all-around (GAA) FET.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate dielectric layer is formed over a channel region in a gate space, one or more conductive layers are formed over the gate dielectric layer, a seed layer is formed over the one or more conductive layers, an upper portion of the seed layer is treated by introducing one or more elements selected from the group consisting of oxygen, nitrogen and fluorine, and a W layer is formed on a lower portion of the seed layer that is not treated to fully fill the gate space. In one or more of the foregoing and following embodiments, no void or no seam is formed in the W layer in the gate fill gap between spacers. In one or more of the foregoing and following embodiments, in the treating, one or more ion implantations is performed to introduce ions of one or more elements selected from the group consisting of oxygen, nitrogen and fluorine to the upper portion. In one or more of the foregoing and following embodiments, in the treating, one or more plasma treatments are performed to introduce ions of one or more elements selected from the group consisting of oxygen, nitrogen and fluorine to the upper portion. In one or more of the foregoing and following embodiments, in the treating, one or more free radical treatments are performed to introduce neutral species of one or more elements selected from the group consisting of oxygen, nitrogen and fluorine to the upper portion. In one or more of the foregoing and following embodiments, the W layer is grown on the lower portion selective to the treated upper portion. In one or more of the foregoing and following embodiments, a height of the lower portion is 10% to 20% of a total height of the seed layer. In one or more of the foregoing and following embodiments, the seed layer includes one of a non-doped W layer, a W layer containing Si, a W layer containing B, or a W layer containing B and Si.

In accordance with another aspect of the present disclosure, in a method of manufacturing a semiconductor device, a fin structure is formed. An upper portion of the fin structure protrudes from an isolation insulating layer disposed over a substrate. A sacrificial gate dielectric layer is formed over the fin structure. A sacrificial gate electrode layer is formed over the sacrificial gate dielectric layer. Gate sidewall spacers are formed. An interlayer dielectric layer is formed. The sacrificial gate electrode layer and the sacrificial gate dielectric layer are removed, thereby forming a gate space in which the upper portion of the fin structure is exposed. A gate dielectric layer is formed over the upper portion of the fin structure in the gate space. One or more work function adjustment layers are formed over the gate dielectric layer. A glue layer is formed over the one or more work function adjustment layers. A seed layer is formed over the glue layer. An upper portion of the seed layer is treated by introducing one or more elements selected from the group consisting of oxygen, nitrogen and fluorine. A body metal layer is formed on a lower portion of the seed layer that is not treated to fully fill the gate space. In one or more of the foregoing and following embodiments, the body metal layer is a W layer, and the seed layer includes one of a non-doped W layer, a W layer containing Si, a W layer containing B, or a W layer containing B and Si. In one or more of the foregoing and following embodiments, the treated upper portion includes one of a non-doped W layer, a W layer containing Si, a W layer containing B, or a W layer containing B and Si, further doped with one or more elements selected from the group consisting of oxygen, nitrogen and fluorine. In one or more of the foregoing and following embodiments, a height of the lower portion is 10% to 20% of a total height of the seed layer. In one or more of the foregoing and following embodiments, in the treating, one or more ion implantations are performed to introduce ions of one or more elements selected from the group consisting of oxygen, nitrogen and fluorine to the upper portion. In one or more of the foregoing and following embodiments, in the treating, one or more plasma treatments are performed to introduce ions of one or more elements selected from the group consisting of oxygen, nitrogen and fluorine to the upper portion. In one or more of the foregoing and following embodiments, in the treating, one or more free radical treatments are performed to introduce neutral species of one or more elements selected from the group consisting of oxygen, nitrogen and fluorine to the upper portion. In one or more of the foregoing and following embodiments, the treating the upper portion comprises introducing one or more elements selected from the group consisting of oxygen, nitrogen and fluorine to a part of the glue layer. In one or more of the foregoing and following embodiments, the glue layer includes TiN, nitrogen is introduced into the part of the glue layer, and a Ti/N ratio of the part of the glue layer is 1.1 to about 2.0. In one or more of the foregoing and following embodiments, the W layer is grown on the lower portion selective to the treated upper portion.

In accordance with another aspect of the present disclosure, in a method of manufacturing a semiconductor device, a gate dielectric layer is formed over the upper portion of the fin structure in the gate space, one or more work function adjustment layers are formed over the gate dielectric layer, a glue layer is formed over the one or more work function adjustment layer, a seed layer is formed over the glue layer, an upper portion of the seed layer is treated to reduce or not to have a nucleation property for a W deposition, and a W layer is formed from a lower portion of the seed layer that is not treated to fully fill the gate space. In one or more of the foregoing and following embodiments, the treating comprises introducing one or more elements selected from the group consisting of oxygen, nitrogen and fluorine to the upper portion.

In accordance with another aspect of the present disclosure, a semiconductor device includes a fin structure protruding from an isolation insulating layer disposed over a substrate and having a channel region, a source/drain region disposed over the substrate, a gate dielectric layer disposed on the channel region, and a gate electrode layer disposed on the gate dielectric layer. The gate electrode layer includes one or more work function adjustment layers over the gate dielectric layer, a glue layer over the one or more work function adjustment layers, a seed layer over the glue layer, and a body metal layer on the seed layer. An upper portion of the seed layer contains one or more of oxygen, nitrogen or fluorine more than a lower portion of the seed layer. In one or more of the foregoing and following embodiments, the seed layer includes one of a non-doped W layer, a W layer containing Si, a W layer containing B, or a W layer containing B and Si. In one or more of the foregoing and following embodiments, a height of the upper portion is 10% to 50% of a height of the lower portion, above the fin structure. In one or more of the foregoing and following embodiments, the semiconductor device further includes an insulating cap layer disposed on the gate electrode layer and gate sidewall spacers disposed over opposing side faces of the gate electrode layer and the insulating cap layer. In one or more of the foregoing and following embodiments, the upper portion is in contact with the insulating cap layer. In one or more of the foregoing and following embodiments, the body metal layer is a W layer. In one or more of the foregoing and following embodiments, the W layer is free from fluorine. In one or more of the foregoing and following embodiments, a part of the glue layer a higher concentration of one or more of oxygen, nitrogen or fluorine than a remaining part. In one or more of the foregoing and following embodiments, the glue layer includes TiN, and a part of the glue layer has a higher N concentration than a remaining part. In one or more of the foregoing and following embodiments, a Ti/N atomic ratio of the part of the glue layer is in a range from 1.1 to 2.0, and a Ti/N atomic ratio of the remaining part of the glue layer is in a range from 0.8 to 1.0.

In one or more of the foregoing and following embodiments, the semiconductor device further includes a metallization contact layers (W or Co or Ru) disposed on the gate electrode layer, and gate sidewall spacers disposed over opposing side faces of the gate electrode layer. In one or more of the foregoing and following embodiments, the upper portion is in contact with the metallization contact layers (W or Co or Ru). In one or more of the foregoing and following embodiments, the semiconductor device further includes a metallization contact layers (W or Co or Ru) as well as insulation cap layer disposed on the gate electrode layer. In one or more of the foregoing and following embodiments, the upper portion is in contact with the metallization contact layers (W or Co or Ru) and also with insulation cap layer.

In accordance with another aspect of the present disclosure, a semiconductor FET includes a gate dielectric layer disposed on the channel region, a gate electrode layer disposed on the gate dielectric layer, an insulating cap layer disposed on the gate electrode layer, and gate sidewall spacers disposed over opposing side faces of the gate electrode layer and the insulating cap layer. The gate electrode layer includes one or more work function adjustment layers over the gate dielectric layer, a glue layer over the one or more work function adjustment layers, a seed layer including W over the glue layer, and a body metal layer including W on the seed layer. A part of the seed layer contains one or more of oxygen, nitrogen or fluorine more than a remaining part of the seed layer. In one or more of the foregoing and following embodiments, a thickness of the seed layer is in a range from 0.5 nm to 10 nm. In one or more of the foregoing and following embodiments, the seed layer further includes one or more of boron or silicon. In one or more of the foregoing and following embodiments, the part of the seed layer is one of a W layer containing nitrogen, a W layer containing boron and nitrogen, a W layer containing silicon and nitrogen, a W layer containing oxygen, a W layer containing boron and oxygen or a W layer containing silicon and oxygen. In one or more of the foregoing and following embodiments, a part of the glue layer a higher concentration of one or more of oxygen, nitrogen or fluorine than a remaining part of the glue layer. In one or more of the foregoing and following embodiments, the glue layer includes TiN, and a part of the glue layer has a higher N concentration than a remaining part. In one or more of the foregoing and following embodiments, a Ti/N atomic ratio of the part of the glue layer is in a range from 1.1 to 2.0, and a Ti/N atomic ratio of the remaining part of the glue layer is in a range from 0.8 to 1.0. In one or more of the foregoing and following embodiments, the body metal layer is free from fluorine.

In accordance with another aspect of the present disclosure, a semiconductor FET includes a gate dielectric layer disposed on the channel region, a gate electrode layer disposed on the gate dielectric layer, a metallization contact layers (W or Co or Ru) disposed on the gate electrode layer, and gate sidewall spacers disposed over opposing side faces of the gate electrode layer, and an insulating cap layer and second interlayer dielectric disposed on either side of metallization contact layers. In one or more of the foregoing and following embodiments, the semiconductor device further includes a metallization contact layers (W or Co or Ru) as well as insulation cap layer disposed on the gate electrode layer. In one or more of the foregoing and following embodiments, the upper portion is in contact with the metallization contact layers (W or Co or Ru) and also partly with insulation cap layer. The gate electrode layer includes one or more work function adjustment layers over the gate dielectric layer, a glue layer over the one or more work function adjustment layers, a seed layer including W over the glue layer, and a body metal layer including W on the seed layer. A part of the seed layer contains one or more of oxygen, nitrogen or fluorine more than a remaining part of the seed layer. In one or more of the foregoing and following embodiments, a thickness of the seed layer is in a range from 0.5 nm to 10 nm. In one or more of the foregoing and following embodiments, the seed layer further includes one or more of boron or silicon. In one or more of the foregoing and following embodiments, the part of the seed layer is one of a W layer containing nitrogen, a W layer containing boron and nitrogen, a W layer containing silicon and nitrogen, a W layer containing oxygen, a W layer containing boron and oxygen or a W layer containing silicon and oxygen. In one or more of the foregoing and following embodiments, a part of the glue layer a higher concentration of one or more of oxygen, nitrogen or fluorine than a remaining part of the glue layer. In one or more of the foregoing and following embodiments, the glue layer includes TiN, and a part of the glue layer has a higher N concentration than a remaining part. In one or more of the foregoing and following embodiments, a Ti/N atomic ratio of the part of the glue layer is in a range from 1.1 to 2.0, and a Ti/N atomic ratio of the remaining part of the glue layer is in a range from 0.8 to 1.0. In one or more of the foregoing and following embodiments, the body metal layer is free from fluorine.

In accordance with another aspect of the present disclosure, a semiconductor device includes fin structures each of which protrudes from an isolation insulating layer disposed over a substrate and has a channel region, a gate dielectric layer disposed on the channel region of each of the fin structures, and a gate electrode layer disposed on the gate dielectric layer. The gate electrode layer includes one or more work function adjustment layers over the gate dielectric layer, a glue layer over the one or more work function adjustment layers, a seed layer over the glue layer, and a body metal layer on the seed layer. The glue layer includes one or more of TiN, TaN, TiSiN or Co, and a part of the glue layer contains one or more of oxygen, nitrogen or fluorine more than a remaining part of the glue layer. In one or more of the foregoing and following embodiments, the part of the glue layer is in contact with a part of the seed layer. In one or more of the foregoing and following embodiments, the part of seed layer contains one or more of oxygen, nitrogen or fluorine more than a remaining part of the seed layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a gate dielectric layer over a channel region in a gate space;
    forming one or more conductive layers over the gate dielectric layer;
    forming a seed layer over the one or more conductive layers;
    treating an upper portion of the seed layer by introducing one or more elements selected from the group consisting of oxygen, nitrogen and fluorine; and
    forming a W layer on a lower portion of the seed layer that is not treated.

2. The method of claim 1, wherein no void or no seam is formed in the W layer.

3. The method of claim 1, wherein the treating comprises one or more ion implantations to introduce ions of one or more elements selected from the group consisting of oxygen, nitrogen and fluorine to the upper portion.

4. The method of claim 1, wherein the treating comprises one or more plasma treatments to introduce ions of one or more elements selected from the group consisting of oxygen, nitrogen and fluorine to the upper portion.

5. The method of claim 1, wherein the treating comprises one or more free radical treatments to introduce neutral species of one or more elements selected from the group consisting of oxygen, nitrogen and fluorine to the upper portion.

6. The method of claim 1, wherein the W layer is grown on the lower portion selective to the treated upper portion.

7. The method of claim 1, wherein a height of the lower portion is 10% to 20% of a total height of the seed layer.

8. The method of claim 1, wherein the seed layer includes one of a non-doped W layer, a W layer containing Si, a W layer containing B, or a W layer containing B and Si.

9. A method of manufacturing a semiconductor device, comprising:
    forming a fin structure, an upper portion of which protrudes from an isolation insulating layer disposed over a substrate;
    forming a sacrificial gate dielectric layer over the fin structure;
    forming a sacrificial gate electrode layer over the sacrificial gate dielectric layer;
    forming gate sidewall spacers;
    forming an interlayer dielectric layer;
    removing the sacrificial gate electrode layer and the sacrificial gate dielectric layer, thereby forming a gate space in which the upper portion of the fin structure is exposed;
    forming a gate dielectric layer over the upper portion of the fin structure in the gate space;
    forming one or more work function adjustment layers over the gate dielectric layer;
    forming a glue layer over the one or more work function adjustment layers;
    forming a seed layer over the glue layer;
    treating an upper portion of the seed layer by introducing one or more elements selected from the group consisting of oxygen, nitrogen and fluorine; and
    forming a body metal layer on a lower portion of the seed layer that is not treated to fully fill the gate space.

10. The method of claim 9, wherein:
    the body metal layer is a W layer, and
    the seed layer includes one of a non-doped W layer, a W layer containing Si, a W layer containing B, or a W layer containing B and Si.

11. The method of claim 10, wherein the treated upper portion includes one of a non-doped W layer, a W layer containing Si, a W layer containing B, or a W layer containing B and Si, further doped with one or more elements selected from the group consisting of oxygen, nitrogen and fluorine.

12. The method of claim 10, wherein a height of the lower portion is 10% to 20% of a total height of the seed layer.

13. The method of claim 12, wherein the treating comprises one or more ion implantations to introduce ions of one or more elements selected from the group consisting of oxygen, nitrogen and fluorine to the upper portion.

14. The method of claim 12, wherein the treating comprises one or more plasma treatments to introduce ions of one or more elements selected from the group consisting of oxygen, nitrogen and fluorine to the upper portion.

15. The method of claim 12, wherein the treating comprises one or more free radical treatments to introduce neutral species of one or more elements selected from the group consisting of oxygen, nitrogen and fluorine to the upper portion.

16. The method of claim 10, wherein the treating the upper portion comprises introducing one or more elements selected from the group consisting of oxygen, nitrogen and fluorine to a part of the glue layer.

17. The method of claim 16, wherein:
the glue layer includes TiN,
nitrogen is introduced into an upper portion of the glue layer, and
a Ti/N ratio of the upper portion of the glue layer is 1.1 to 2.0.

18. The method of claim 10, wherein the W layer is grown on the lower portion selective to the treated upper portion.

19. A method of manufacturing a semiconductor device, comprising:
forming a gate dielectric layer over the upper portion of the fin structure in a gate space;
forming one or more work function adjustment layers over the gate dielectric layer;
forming a glue layer over the one or more work function adjustment layers;
forming a seed layer over the glue layer;
treating an upper portion of the seed layer to reduce or to not have a nucleation property for a W deposition; and
forming a W layer from a lower portion of the seed layer that is not treated to reduce or to not have a nucleation property for a W deposition to fully fill the gate space.

20. The method of claim 19, wherein the treating comprises introducing one or more elements selected from the group consisting of oxygen, nitrogen and fluorine to the upper portion.

* * * * *